United States Patent
Nakatsuka et al.

(10) Patent No.: US 7,492,238 B2
(45) Date of Patent: Feb. 17, 2009

(54) RADIO-FREQUENCY SWITCHING CIRCUIT AND SEMICONDUCTOR DEVICE

(75) Inventors: Tadayoshi Nakatsuka, Osaka (JP); Atsushi Suwa, Osaka (JP); Motoo Nakagawa, Osaka (JP); Masakazu Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 163 days.

(21) Appl. No.: 11/591,462

(22) Filed: Nov. 2, 2006

(65) Prior Publication Data

US 2007/0103252 A1  May 10, 2007

(30) Foreign Application Priority Data

Nov. 4, 2005  (JP) .............................. 2005-321214

(51) Int. Cl.
*H01P 1/10* (2006.01)
*H01P 1/15* (2006.01)
*H03H 11/34* (2006.01)

(52) U.S. Cl. ..................................... 333/103; 333/101

(58) Field of Classification Search ................. 333/101, 333/103, 132

See application file for complete search history.

(56) References Cited

U.S. PATENT DOCUMENTS 7,295,814 B2 * 11/2007 Yamashita et al. ............. 455/83
7,307,490 B2 * 12/2007 Kizuki et al. ................ 333/101

FOREIGN PATENT DOCUMENTS

JP        9-238059 A      9/1997

* cited by examiner

*Primary Examiner*—Dean O Takaoka
(74) *Attorney, Agent, or Firm*—McDermott Will & Emery LLP

(57) ABSTRACT

A common terminal 500 is connected to drains of FETs 101 and 102 via a capacitor 400. FETs 111 to 114 are serially connected, and inserted between a source of the FET 101 and a terminal 501 via a capacitor 401. Similarly, each of: FETs 121 to 124; FETs 131 to 133; FETs 141 to 143; FETs 151 to 153; and FETs 161 to 163 is inserted between the source of the FET 101 or an FET 102 and a corresponding one of terminals 502 to 506. This configuration allows a stray capacitance value of a transmission/reception path to be reduced at the time of transmission/reception, thereby obtaining a favorable radio-frequency characteristic.

8 Claims, 20 Drawing Sheets

RADIO-FREQUENCY SWITCHING CIRCUIT AND SEMICONDUCTOR DEVICE

BACKGROUND OF THE INVENTION

1. Field of the Invention

The present invention relates to a radio-frequency switching circuit and a semiconductor device, and particularly to a radio-frequency switching circuit used for, e.g., a multi-band communication device compatible with a plurality of frequency bands, and a semiconductor device having a semiconductor substrate on which the radio-frequency switching circuit is integrated.

2. Description of the Background Art

In recent years, there has been a demand for mobile communication devices such as cellar phones to be decreased in size and improve in performance. In order to meet such a demand, Antenna Switch MMIC technology has been proposed in which a field-effect transistor (hereinafter, referred to as FET) using gallium arsenide (GaAs) is used as a signal path switching element such as an antenna.

However, an antenna switch MMIC structured by FETs has a drawback that a radio-frequency characteristic thereof is deteriorated if a high-power signal is inputted when a power supply voltage is as low as, e.g., 3V. In, e.g., Japanese Laid-Open Patent Publication 9-238059, a radio-frequency switching circuit having FETs thereof connected in a multistage manner is proposed, which prevents the deterioration of the radio-frequency characteristic even if a high-power signal is inputted. Hereinafter, such a conventional radio-frequency switching circuit disclosed in the above publication will be described with reference to FIG. 18.

In FIG. 18, a conventional radio-frequency switching circuit 51 comprises: FETs 111 to 114, 121 to 124, 131 to 134, 141 to 144, 151 to 154 and 161 to 164; resistors 211 to 214, 221 to 224, 231 to 234, 241 to 244, 251 to 254, 261 to 264, 311 to 314, 321 to 324, 331 to 334, 341 to 344, 351 to 354 and 361 to 364; capacitors 400 to 406; a common terminal 500; transmission terminals 501 and 502 (Tx); reception terminals 503 to 506 (Rx); and control terminals 601 to 606.

The FETs 111 to 114 respectively have drains and sources thereof connected via the resistors 211 to 214 which are respectively in parallel with the FETs 111 to 114. The gates of the FETs 111 to 114 are connected to the control terminal 601 via the resistors 311 to 314, respectively. The FETs 111 to 114 are serially connected. The drain of the FET 111 is connected to the common terminal 500 via the capacitor 400, and the source of the FET 114 is connected to the transmission terminal 501 via the capacitor 401. The other FETs are connected in a same manner as that of the FETs 111 to 114.

When a radio-frequency signal is transmitted from the transmission terminal 501 to the common terminal 500, a high voltage (e.g., 3V) is applied to the control terminal 601, and a low voltage (e.g., 0V) is applied to the control terminals 602 to 606. This causes the FETs 111 to 114 to be in on-state, and the other FETs to be in off-state. As a result, the radio-frequency signal is transmitted from the transmission terminal 501 to the common terminal 500.

FIG. 18 shows an exemplary configuration in which four FETs are serially connected in order to withstand an input signal power of 30 dBm when a power supply voltage is 3V. This configuration allows that an inputted signal voltage is divided by the four FETs to be controlled by a control voltage of 3V. FIG. 19 shows an equivalent circuit in which a signal is transmitted from the transmission terminal 501. Here, the FETs 111 to 114 in on-state are represented by resistors, and the other FETs in off-state are represented by capacitors. As shown in FIG. 19, the number of capacitance components of the FETs in off-state increases in accordance with an increase in the number of transmission paths. The increased number of capacitance components causes a deterioration of frequency characteristic, thereby increasing insertion loss.

When a radio-frequency signal is transmitted from the common terminal 500 to the reception terminal 503, a high voltage is applied to the control terminal 603, and a low voltage is applied to the control terminals 601, 602 and 604 to 606. This causes the FETs 131 to 134 to be in on-state, and the other FETs to be in off-state. Also in this case, there is the problem of the deteriorated frequency characteristic caused by the capacitance components of the FETs in off-state.

It is expected that in the future, mobile communication devices will have functions as multi-band devices compatible with a plurality of frequency bands, and the number of transmission/reception paths therein for radio-frequency signals will increase. However, as described above, if the number of transmission/reception paths is simply increased, capacitance values of FETs in off-state (i.e., off-capacitances) become great. This causes a problem that frequency dependency becomes great and insertion loss at a radio frequency is increased.

Also, in order to obtain isolation between a transmission terminal and a reception terminal, a shunt circuit is required to be provided for each terminal as shown in an exemplary radio-frequency switching circuit 52 of FIG. 20. However, when a circuit has a configuration in which a shunt circuit is provided for each terminal, complexity of the configuration of the circuit increases in accordance with an increase in the number of transmission/reception paths. This causes a problem that a semiconductor chip increases in size.

SUMMARY OF THE INVENTION

Therefore, an object of the present invention is to provide a radio-frequency switching circuit and a semiconductor device which are capable of improving a frequency characteristic, thereby obtaining favorable insertion loss even at a radio frequency, and also capable of efficiently using a shunt circuit, thereby realizing a high isolation characteristic.

The present invention is directed to a radio-frequency switching circuit for controlling a transmission of a radio-frequency signal by changing a connection status between a common terminal and a plurality of independent terminals, and to a semiconductor device having a semiconductor substrate on which the radio-frequency switching circuit is integrated. In order to realize the above invention, the radio-frequency switching circuit comprises: a plurality of common switching sections each having a first terminal to be connected, for a radio-frequency component, to the common terminal; and a plurality of fundamental switching sections, which are provided respectively corresponding to the plurality of independent terminals, each having a first terminal connected to a second terminal of any one of the plurality of common switching sections and having a second terminal to be connected, for the radio-frequency component, to any one of the plurality of independent terminals.

In the case where radio-frequency signals are transmitted and received, it is desired that in the radio-frequency switching circuit, a common switching section for transmission is provided on transmission paths, through which radio-frequency signals respectively from transmission terminals among the plurality of independent terminals are transmitted to the common terminal, and a common switching section for reception is provided on reception paths, through which radio-frequency signals from the common terminal are respectively received by reception terminals among the plurality of independent terminals.

The radio-frequency switching circuit may further comprise a common shunt circuit for controlling grounding of the second terminal of at least one of the plurality of common switching sections, or a fundamental shunt circuit for controlling grounding of the second terminal of at least one of the plurality of fundamental switching sections. Particularly in the case where radio-frequency signals are transmitted and received, it is preferred that the radio-frequency switching circuit further comprises: a common shunt circuit for transmission for controlling grounding of the second terminal of the common switching section for transmission; and a common shunt circuit for reception for controlling grounding of the second terminal of the common switching section for reception. Alternatively, the radio-frequency switching circuit may further comprise: a fundamental shunt circuit for transmission for controlling grounding of the second terminal of at least one of a plurality of fundamental switching sections for transmission which are connected to the transmission terminals; and a fundamental shunt circuit for reception for controlling grounding of the second terminal of at least one of a plurality of fundamental switching sections for reception which are connected to the reception terminals.

Typically, the plurality of common switching sections each are structured by one switching element, two or more switching elements which are serially connected, or three or more switching elements which are serially and parallel connected in a hierarchical manner. The plurality of fundamental switching sections each are structured by one switching element, or two or more switching elements which are serially connected. The common shunt circuit is structured by serially connected switching elements, a number of which is same as a number of switching elements by which each fundamental switching section connected to the common shunt circuit is structured. The fundamental shunt circuit is structured by serially connected switching elements, a number of which is same as a number of switching elements by which each fundamental switching section connected to the fundamental shunt circuit is structured.

It is conceivable that a reactance circuit connects terminals of each switching element. The reactance circuit may be structured by a capacitor, inductor, or a combination of the capacitor and the inductor. Each switching element may be a field-effect transistor. A multi-gate field-effect transistor maybe used as the one switching element, as the two or more switching elements, and as the three or more switching elements.

It is desired that each of the plurality of common switching sections performs an on-operation in conjunction with an on-operation performed by any of the plurality of fundamental switching sections which is connected to the second terminal of said each of the plurality of common switching sections. Particularly in the case where radio-frequency signals are transmitted and received, it is preferred that in conjunction with an on-operation performed by any of a plurality of fundamental switching sections for transmission provided on the transmission paths of the radio-frequency signals, the common switching section for transmission and the common (or fundamental) shunt circuit for reception each perform an on-operation, and the common switching section for reception and the common (or fundamental) shunt circuit for transmission each perform an off-operation. It is also preferred that in conjunction with an on-operation performed by any of a plurality of fundamental switching sections for reception provided on the reception paths of the radio-frequency signals, the common switching section for reception and the common (or fundamental) shunt circuit for transmission each perform a non-operation, and the common switching section for transmission and the common (or fundamental) shunt circuit for reception each perform an off-operation.

In this case, a logical OR of a plurality of control signals for controlling the plurality of fundamental switching sections for transmission provided on the transmission paths of the radio-frequency signals maybe supplied via diodes to the common switching section for transmission and the common (or fundamental) shunt circuit for reception, and a logical OR of a plurality of control signals for controlling the plurality of fundamental switching sections for reception provided on the reception paths of the radio-frequency signals may be supplied via diodes to the common switching section for reception and the common (or fundamental) shunt circuit for transmission. The diodes each may be structured by short-circuiting a drain and a source of a field-effect transistor.

The above-described present invention allows a stray capacitance value of a transmission path to be reduced at the time of transmission, and allows a stray capacitance value of a reception path to be reduced at the time of reception, thereby obtaining favorable insertion loss even at a radio frequency. Also, according to the present invention, isolation between terminals can be obtained with a small-sized circuit configuration.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
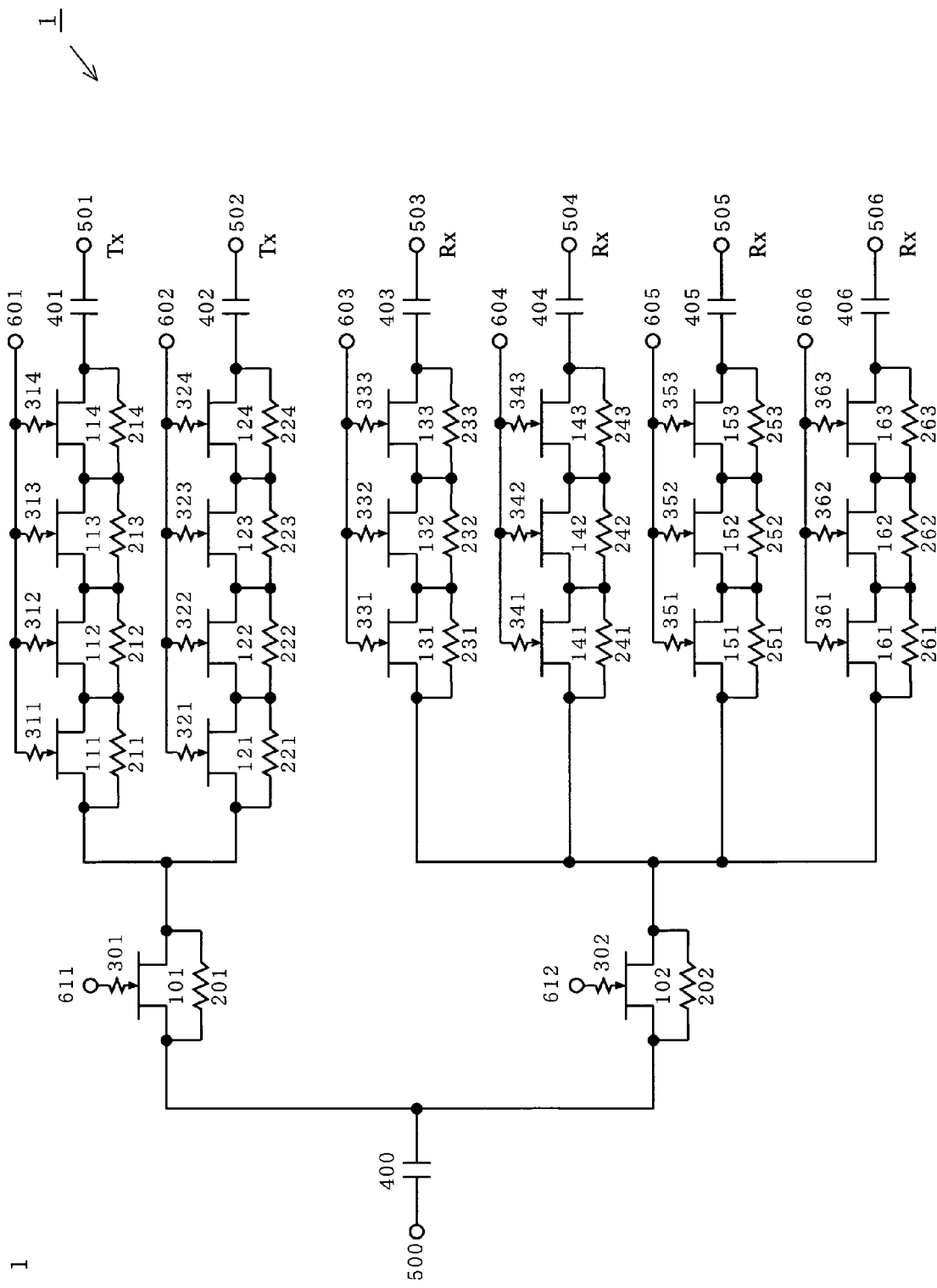
FIG. 1 shows a configuration of a radio-frequency switching circuit 1 according to a first embodiment of the present invention.

FIG. 1 shows a configuration of a radio-frequency switching circuit 1 according to a first embodiment of the present invention. The radio-frequency switching circuit 1 comprises: FETs 101, 102, 111 to 114, 121 to 124, 131 to 133, 141 to 143, 151 to 153 and 161 to 163; resistors 201, 202, 211 to 214, 221 to 224, 231 to 233, 241 to 243, 251 to 253, 261 to 263, 301, 302, 311 to 314, 321 to 324, 331 to 333, 341 to 343, 351 to 353 and 361 to 363; capacitors 400 to 406; a common terminal 500; independent terminals 501 to 506; and control terminals 601 to 606, 611 and 612. In the present embodiment, the independent terminals 501 and 502 are transmission terminals TX, and the independent terminal 503 to 506 are reception terminals RX. The FETs are used as switching elements.

The common terminal 500 is connected to a drain of each of the FETs 101 and 102 via the capacitor 400. The FETs 101 and 102 respectively have drains and sources thereof connected via the resistors 201 and 202 which are respectively in parallel with the FETs 101 and 102. The control terminals 611 and 612 are respectively connected to gates of the FETs 101 and 102 respectively via the resistors 301 and 302. The FET 101 functions as a common switching section for transmission, and the FET 102 functions as a common switching section for reception.

The FETs 111 to 114 respectively have drains and sources thereof connected via the resistors 211 to 214 which are respectively in parallel with the FETs 111 to 114. The control terminal 601 is connected to gates of the FETs 111 to 114 via the resistors 311 to 314, respectively. The FETs 111 to 114 are serially connected. The drain of the FET 111 is connected to the source of the FET 101, and the source of the FET 114 is connected via the capacitor 401 to the transmission terminal 501. Similarly, the FETs 121 to 124 respectively have drains and sources thereof connected via the resistors 221 to 224 which are respectively in parallel with the FETs 121 to 124. The control terminal 602 is connected to gates of the FETs 121 to 124 via the resistors 321 to 324, respectively. The FETs 121 to 124 are serially connected. The drain of the FET 121 is connected to the source of the FET 101, and the source of the FET 124 is connected via the capacitor 402 to the transmission terminal 502. Each of: the FETs 111 to 114; and the FETs 121 to 124 functions as a fundamental switching section for transmission.

The FETs 131 to 133 respectively have drains and sources thereof connected via the resistors 231 to 233 which are respectively in parallel with the FETs 131 to 133. The control terminal 603 is connected to gates of the FETs 131 to 133 via the resistors 331 to 333, respectively. The FETs 131 to 133 are serially connected. The drain of the FET 131 is connected to a source of the FET 102, and the source of the FET 133 is connected via the capacitor 403 to the reception terminal 503. Similarly, the FETs 141 to 143 respectively have drains and sources thereof connected via the resistors 241 to 243 which are respectively in parallel with the FETs 141 to 143. The control terminal 604 is connected to gates of the FETs 141 to 143 via the resistors 341 to 343, respectively. The FETs 141 to 143 are serially connected. The drain of the FET 141 is connected to the source of the FET 102, and the source of the FET 143 is connected via the capacitor 404 to the reception terminal 504. Also, the FETs 151 to 153 respectively have drains and sources thereof connected via the resistors 251 to 253 which are respectively in parallel with the FETs 151 to 153. The control terminal 605 is connected to gates of the FETs 151 to 153 via the resistors 351 to 353, respectively. The FETs 151 to 153 are serially connected. The drain of the FET 151 is connected to the source of the FET 102, and the source of the FET 153 is connected via the capacitor 405 to the reception terminal 505. Further, the FETs 161 to 163 respectively have drains and sources thereof connected via the resistors 261 to 263 which are respectively in parallel with the FETs 161 to 163. The control terminal 606 is connected to gates of the FETs 161 to 163 via the resistors 361 to 363, respectively. The FETs 161 to 163 are serially connected. The drain of the FET 161 is connected to the source of the FET 102, and the source of the FET 163 is connected via the capacitor 406 to the reception terminal 506. Each of: the FETs 131 to 133; 141 to 143; 151 to 153; and 161 to 163 functions as a fundamental switching section for reception.

The radio-frequency switching circuit 1 having the above-described configuration according to the first embodiment includes two transmission paths, through which radio-frequency signals respectively inputted from the transmission terminals 501 and 502 are outputted to the common terminal 500, and four reception paths through which a signal inputted from the common terminal 500 is outputted from any of the reception terminals 503 to 506. In the circuit 1, a high or low voltage is applied to any of the control terminals 601 to 606, 611 and 612 so as to switch a selected path.

It is assumed here that: the FET 101, which is commonly used by the two transmission paths at the time of transmission, and the FET 102, which is commonly used by the four reception paths at the time of reception, each have a gate width of $W_{g1}$ and an off-capacitance $C_1$; the number of rows (i.e., the number of serial connections) of each thereof is n; the FETs other than the FETs 101 and 102 each have a gate width of $W_{g2}$ and an off-capacitance $C_2$; the number of rows of each thereof is m; the number of switchable paths in the radio-frequency switching circuit 1 is k; and each FET has an off-capacitance $C_0$ per unit length. In this case, a condition, under which distribution voltages respectively applied to all the FETs are equal, is represented by the following equation (1) regardless of n and m.

$$C1 = k \times C2 \quad (1)$$

Note that since the off-capacitance of each FET is directly propositional to the gate width thereof, a relationship between Wg1 and Wg2 is represented by the following equation (2).

$$Wg1 = k \times Wg2 \quad (2)$$

In the examplary radio-frequency switching circuit 1, the gate width of each of the FETs 131 to 133, 141 to 143, 151 to 153 and 161 to 163 of the reception paths is 1 mm, and the number of the reception paths is four. Accordingly, the gate width of the common FET 102 is set to 4 mm. The above equations (1) and (2) are not required to be satisfied for the FET 101 of the transmission paths, because a voltage, which is applied to the FET 101 in off-state at the time of reception, is minimal. For this reason, the gate width of the FET 101 is set to 4 mm. Considering insertion loss, the gate width of each of the FETs 111 to 114 and 121 to 124 of the transmission paths is set to 4 mm.

Hereinafter, manners in which the radio-frequency switching circuit 1 operates will be described. First, a manner in which the circuit 1 operates at the time of transmission will be described. When a signal is transmitted from the transmission terminal 501 to the common terminal 500, a high voltage (e.g., 3V) is applied to the control terminals 601 and 611, and a low voltage (e.g., 0V) is applied to the control terminals 602 to 606 and 612. Since this causes the FETs 101 and 111 to 114 to be in on-state and the other FETs to be in off-state, a transmission signal is transmitted from the transmission terminal 501 to the common terminal 500. At this point, a capacitance between a ground and a path connecting the transmission terminal 501 and the common terminal 500 is represented by a value obtained from adding up the following: the sum of off-capacitances of the FETs 121 to 124; and a value obtained by performing serial arithmetic for the off-capacitance of the FET 102 and the sum of off-capacitances of the FETs 131 to 133, 141 to 143, 151 to 153 and 161 to 163.

Figure 2:
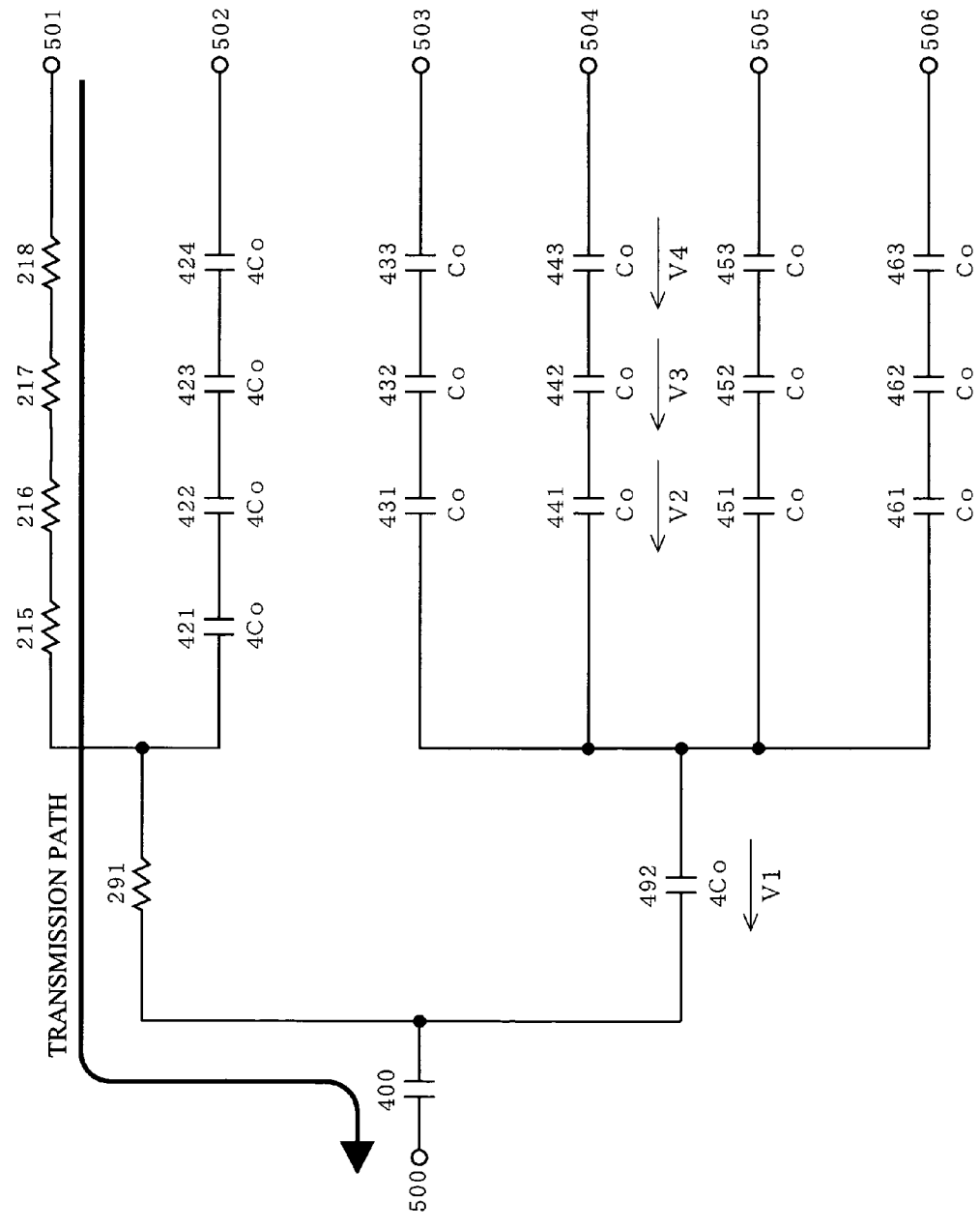
FIG. 2 shows an equivalent circuit of the radio-frequency switching circuit 1 operating at the time of transmission.

An equivalent circuit of the radio-frequency switching circuit 1 operating at the time of transmission is shown in FIG. 2. In FIG. 2, resistors 291 and 215 to 218 represent on-resistances of the FETs 101 and 111 to 114, respectively. Also, capacitors 492, 421 to 424, 431 to 433, 441 to 443, 451 to 453 and 461 to 463 respectively represent off-capacitances of the FETs 102, 121 to 124, 131 to 133, 141 to 143, 151 to 153 and 161 to 163. When it is assumed here that an off-capacitance value per 1 mm of gate width is C0, the capacitors 421 to 424 each have an off-capacitance value of "4C0", and the capacitors 431 to 433, 441 to 443, 451 to 453 and 461 to 463 each have an off-capacitance value of "C0".

Accordingly, assuming that an off capacitance value per 1 mm of gate width is C0, a capacitance between the ground and the path connecting the transmission terminal 501 and common terminal 500 is "2C0" which is 67% of a conventional capacitance therebetween. Such a reduction of capacitance greatly improves a radio-frequency characteristic. When a large signal is applied to off-state FETs at the time of transmission, a signal voltage is divided according to the off-capacitances of the off-state FETs. Since the gate widths of the FETs 121 to 124 are equal as shown in FIG. 2, the signal voltage is equally divided according to the capacitors 421 to 424 which represent off-capacitances of the FETs 121 to 124. This makes it possible to obtain harmonic distortion equivalent to that of a conventional radio-frequency switching circuit. The reception terminals 503 to 506 are set such that a voltage to be applied to each of the FETs of the reception paths is equal. The off-capacitance values of the FETs 131 to 133 each are "C0", and a capacitance value between the source of the FET 102 and the reception terminal 503 is "C0/3". Similarly, a capacitance value between the source of the FET 102 and each of the reception terminals 504 to 506 is "C0/3". Since impedance of each reception terminal is low, the sum of capacitance values between the source of the FET 102 and the reception terminals is "4C0/3" which is the quadruple of C0/3. Since the signal voltage is divided in accordance with the value 4C0/3 and the off-capacitance 4C0/3 of the FET 102, ¼ of the signal voltage is equally applied to each of: the FETs 131 to 133; 141 to 143; 151 to 153; and 161 to 163. As a result, V1=V2=V3=V4 is obtained. Thus, the circuit 1 can obtain harmonic performance equivalent to that of the conventional radio-frequency switching circuit.

Next, a manner in which the circuit 1 operates at the time of reception will be described. When a signal is transmitted from the common terminal 500 to the reception terminal 503, a high voltage is applied to the control terminals 603 and 612, and a low voltage is applied to the control terminals 601, 602, 604 to 606, and 612. This causes the FETs 102 and 131 to 133 to be in on-state, and the other FETs to be in off-state. As a result, a reception signal is transmitted from the common terminal 500 to the reception terminal 503.

Figure 3:
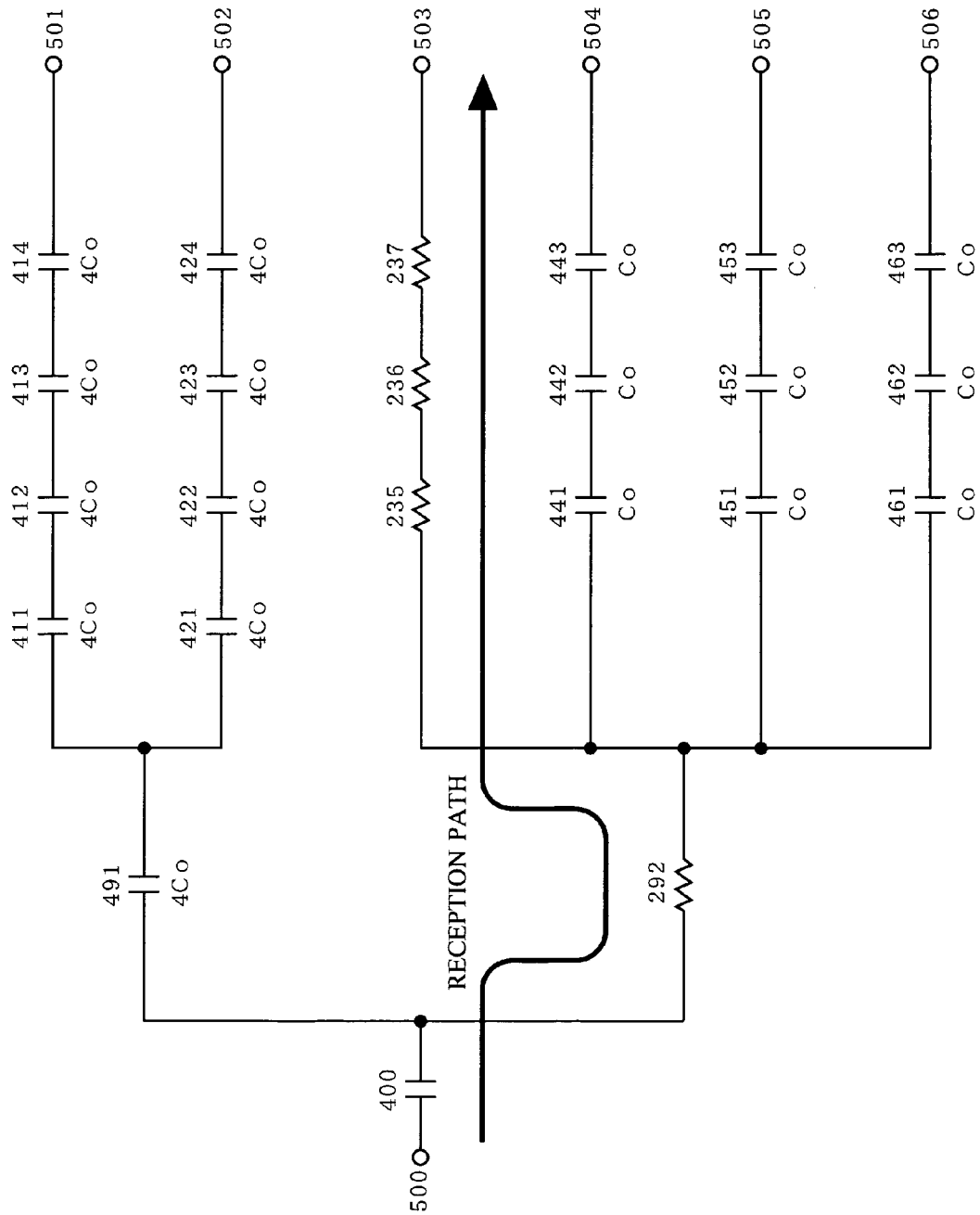
FIG. 3 shows an equivalent circuit of the radio-frequency switching circuit 1 operating at the time of reception.

An equivalent circuit of the radio-frequency switching circuit 1 operating at the time of reception is shown in FIG. 3. In FIG. 3, resistors 292 and 235 to 237 represent on-resistances of the FETs 102 and 131 to 133. Also, capacitors 491, 411 to 414, 421 to 424, 441 to 443, 451 to 453 and 461 to 463 represent off-capacitances of the FETs 101, 111 to 114, 121 to 124, 141 to 143, 151 to 153 and 161 to 163. When the above assumption is applied hereto, a capacitance between a ground and the path connecting the reception terminal 503 and common terminal 500 is "2.3×C0" which is 67% of a conventional capacitance therebetween.

Figure 4A:
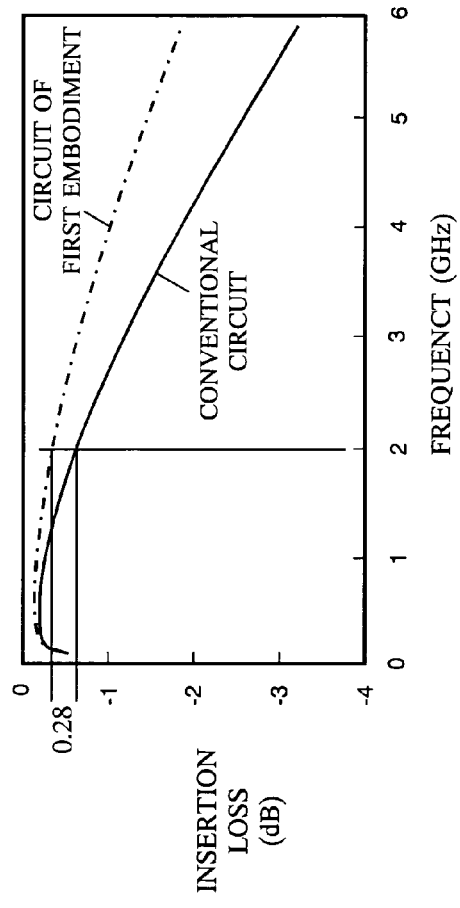
FIG. 4A shows a frequency characteristic of insertion loss of the radio-frequency switching circuit 1 at the time of transmission.
Figure 4B:
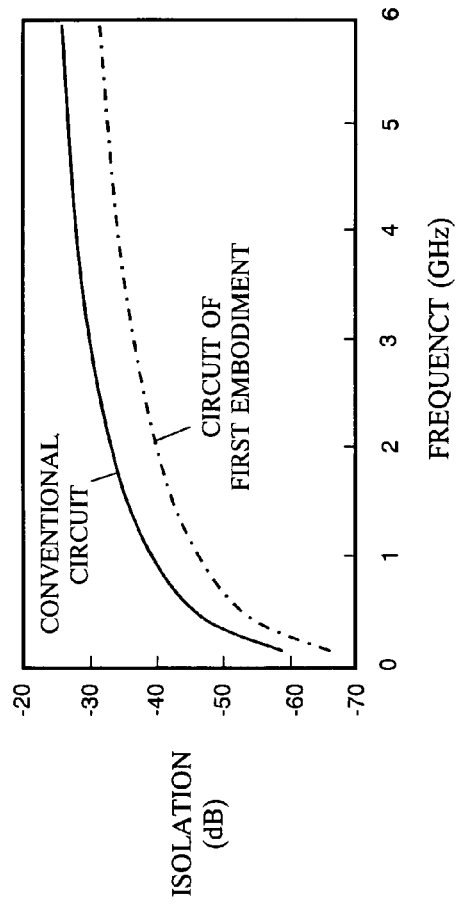
FIG. 4B shows a frequency characteristic of isolation of the radio-frequency switching circuit 1 at the time of transmission.

FIG. 4A shows a result of comparing insertion losses, which occur at the time of transmission, of the radio-frequency switching circuit 1 according to the first embodiment and a conventional radio-frequency switching circuit. FIG. 4B shows a result of comparing isolations, which are obtained at the time of transmission, of the radio-frequency switching circuit 1 according to the first embodiment and the conventional radio-frequency switching circuit. FIG. 4A shows values of the insertion losses occurring at the time of signal transmission from the transmission terminal 501 to the common terminal 500, and FIG. 4b shows values of the isolations which are obtained between the transmission terminal 501 and reception terminal 503 at the time of measuring the insertion losses. Here, a high voltage applied to each control terminal is 3V, and a low voltage applied to each control terminal is 0V.

At a frequency of 2 GHz, the insertion loss of the conventional radio-frequency switching circuit is 0.66 dB, whereas the insertion loss of the radio-frequency switching circuit 1 according to the first embodiment is 0.38 dB. Thus, the insertion loss is improved by 0.28 dB. The higher the frequency, the greater is the difference in the insertion loss between the circuit 1 and the conventional radio-frequency switching circuit. At a frequency of 5 GHz, the insertion loss of the conventional radio-frequency switching circuit is 2.67 dB, whereas the insertion loss of the radio-frequency switching circuit 1 according to the first embodiment is 1.43 dB. Thus, the insertion loss is improved by 1.24 dB. At a frequency of 2 GHz, the isolation value of the conventional radio-frequency switching circuit is 32 dB, whereas the isolation value of the radio-frequency switching circuit 1 according to the first embodiment is 40 dB. Thus, the isolation value is improved by 8 dB.

Figure 5A:
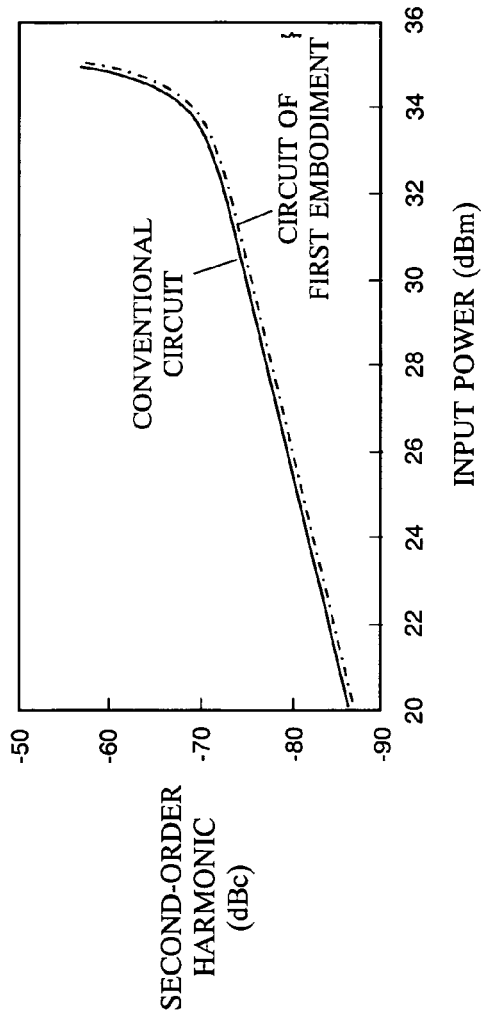
FIG. 5A shows a frequency characteristic of a second-order harmonic of the radio-frequency switching circuit 1.
Figure 5B:
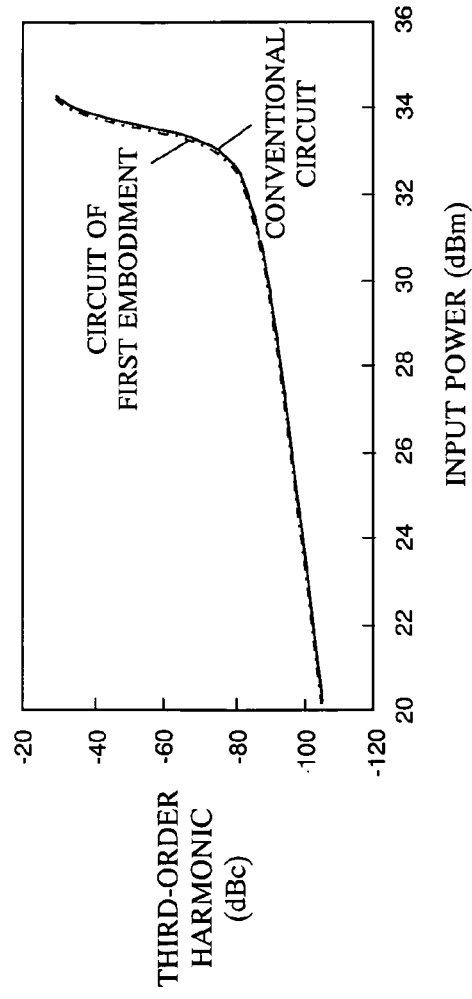
FIG. 5B shows a frequency characteristic of a third-order harmonic of the radio-frequency switching circuit 1.

FIG. 5A shows input power dependence of second-order harmonic distortion occurring at the time of transmission, and FIG. 5B shows input power dependence of third-order harmonic distortion occurring at the time of transmission. As shown in FIGS. 5A and 5B, when input power is 31 dBm, the second-order harmonic distortion is −73 dBc and the third-order harmonic distortion is −86 dBc, which are favorable characteristics equivalent to those of the conventional radio-frequency switching circuit.

Figure 6A:
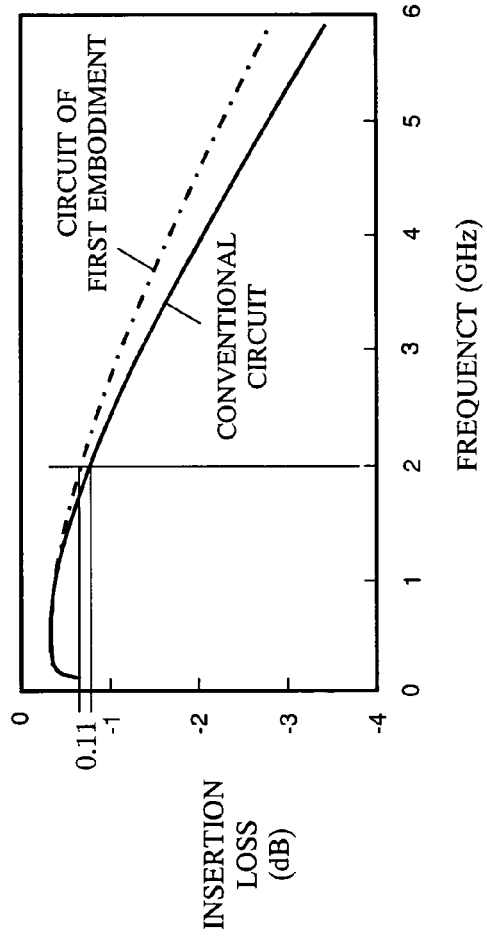
FIG. 6A shows a frequency characteristic of insertion loss of the radio-frequency switching circuit 1 at the time of reception.
Figure 6B:
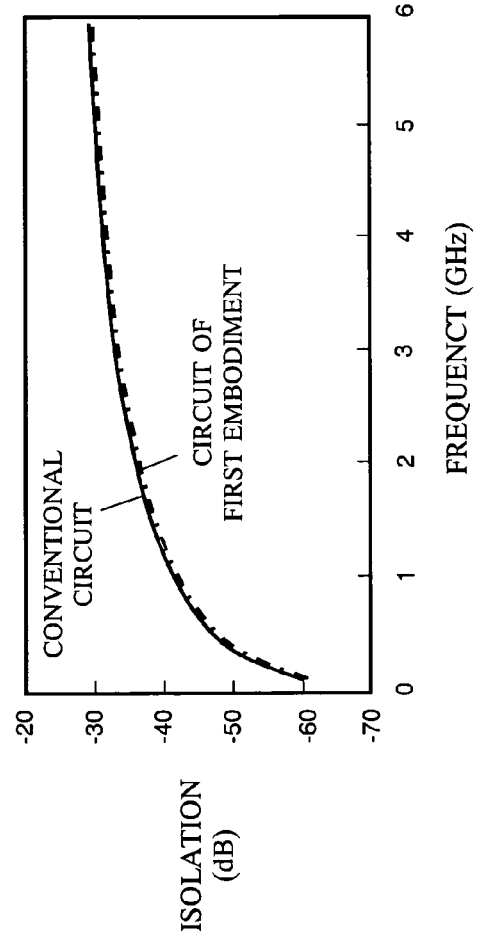
FIG. 6B shows a frequency characteristic of isolation of the radio-frequency switching circuit 1 at the time of reception.

FIG. 6A shows a result of comparing insertion losses, which occur at the time of reception, of the radio-frequency switching circuit 1 according to the first embodiment and the conventional radio-frequency switching circuit. FIG. 6B shows a result of comparing isolations, which are obtained at the time of reception, of the radio-frequency switching circuit 1 according to the first embodiment and the conventional radio-frequency switching circuit. FIG. 6A shows values of the insertion losses occurring at the time of signal reception by the reception terminal 503 from the common terminal 500, and FIG. 6B shows values of the isolations which are obtained between the transmission terminal 501 and reception terminal 503 at the time of measuring the insertion losses. Here, a high voltage applied to each control terminal is 3V, and a low voltage applied to each control terminal is 0V. At a frequency of 2 GHz, the insertion loss of the conventional radio-frequency switching circuit is 0.76 dB, whereas the insertion loss of the radio-frequency switching circuit 1 according to the first embodiment is 0.65 dB. Thus, the insertion loss is improved by 0.11 dB. The isolation value of the circuit 1 is equivalent to that of the conventional radio-frequency switching circuit.

As described above, the radio-frequency switching circuit 1 according to the first embodiment of the present invention is capable of, at the time of transmission/reception, reducing a stray capacitance value of a transmission/reception path, thereby obtaining an optimal radio-frequency characteristic.

Second Embodiment

Figure 7:
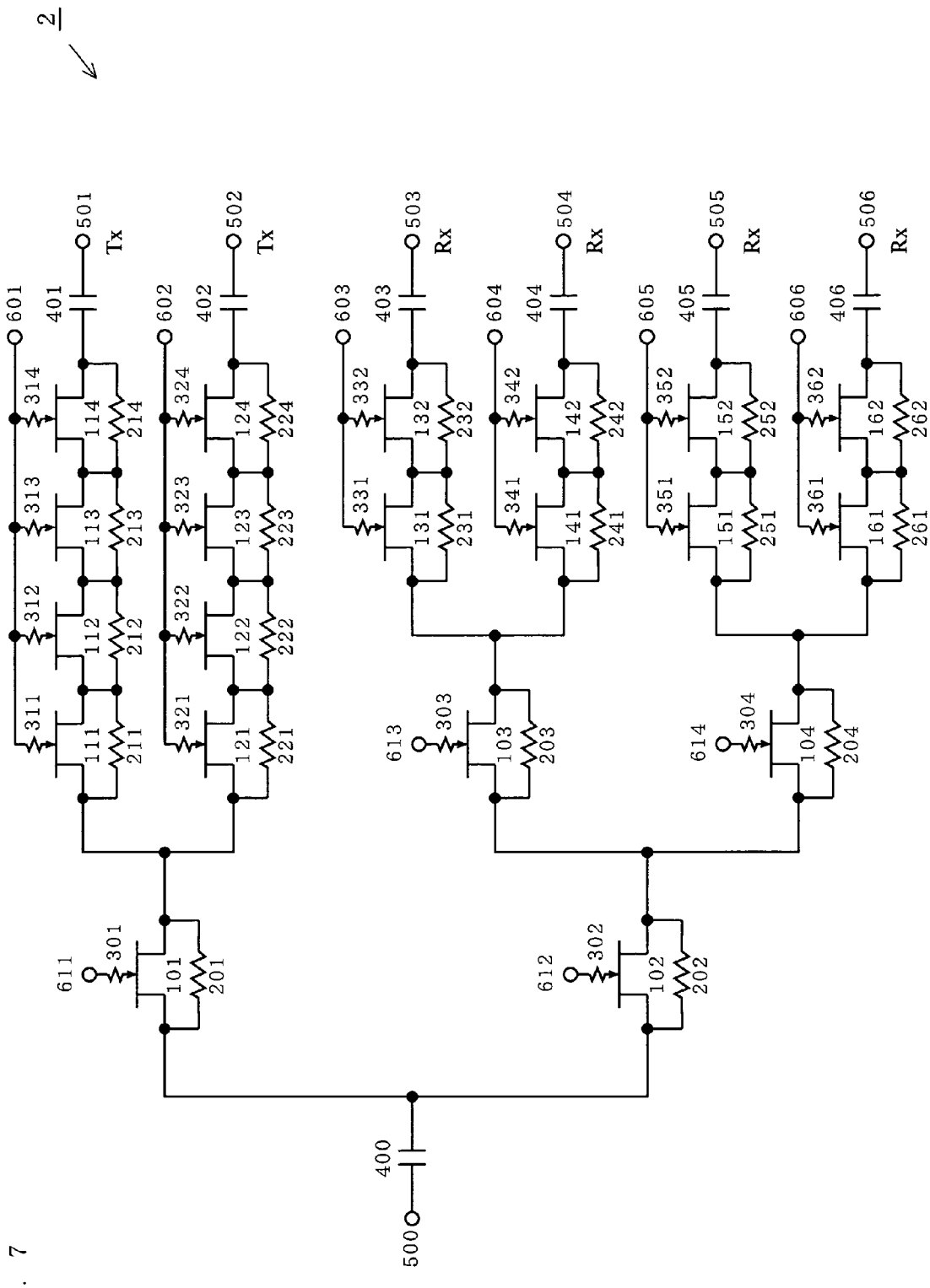
FIG. 7 shows a configuration of a radio-frequency switching circuit 2 according to a second embodiment of the present invention.

FIG. 7 shows a configuration of a radio-frequency switching circuit 2 according to a second embodiment of the present invention. The radio-frequency switching circuit 2 according to the second embodiment comprises: FETs 101 to 104, 111 to 114, 121 to 124, 131, 132, 141, 142, 151, 152, 161 and 162; resistors 201 to 204, 211 to 214, 221 to 224, 231, 232, 241, 242, 251, 252, 261, 262, 301 to 304, 311 to 314, 321 to 324, 331, 332, 341, 342, 351, 352, 361 and 362; capacitors 400 to 406; a common terminal 500; independent terminals 501 to 506; and control terminals 601 to 606 and 611 to 614.

As shown in FIG. 7, the radio-frequency switching circuit 2 according to the second embodiment has a configuration which is a result of replacing the FETs 133, 143, 153 and 163 and resistors 233, 243, 253, 263, 333, 343, 353 and 363 of the radio-frequency switching circuit 1 according to the first embodiment with the FETs 103 and 104, resistors 203, 204, 303 and 304 and control terminals 613 and 614 which are serially and parallel connected in a hierarchical manner. Since a fundamental function and effect of the radio-frequency switching circuit 2 are same as those of the circuit 1 of the above first embodiment, the circuit 2 will be described below with a focus on an effect provided by component elements thereof which are different from those of the circuit 1.

The FETs 101, 111 to 114 and 121 to 124 each have a gate width of 4 mm. The FETs 131, 132, 141, 142, 151, 152, 161 and 162 each have a gate width of 1 mm. The FET 102 has a gate width of 3.3 mm. This configuration of the radio-frequency switching circuit 2 improves isolation between the reception terminals 503 and 504 and the reception terminals 505 and 506. For example, at a frequency of 2 GHz, an isolation of 30 dB is obtained between the reception terminals 503 and 505 in the radio-frequency switching circuit 1 according to the first embodiment, whereas an isolation of no less than 40 dB is obtained therebetween in the radio-frequency switching circuit 2 according to the second embodiment.

As described above, in the radio-frequency switching circuit 2 according to the second embodiment of the present invention, an FET for common use is provided for an arbitrary number of reception paths. Such a configuration of the circuit 2 is useful for the case where obtaining isolation between terminals is crucial.

Third Embodiment

Figure 8:
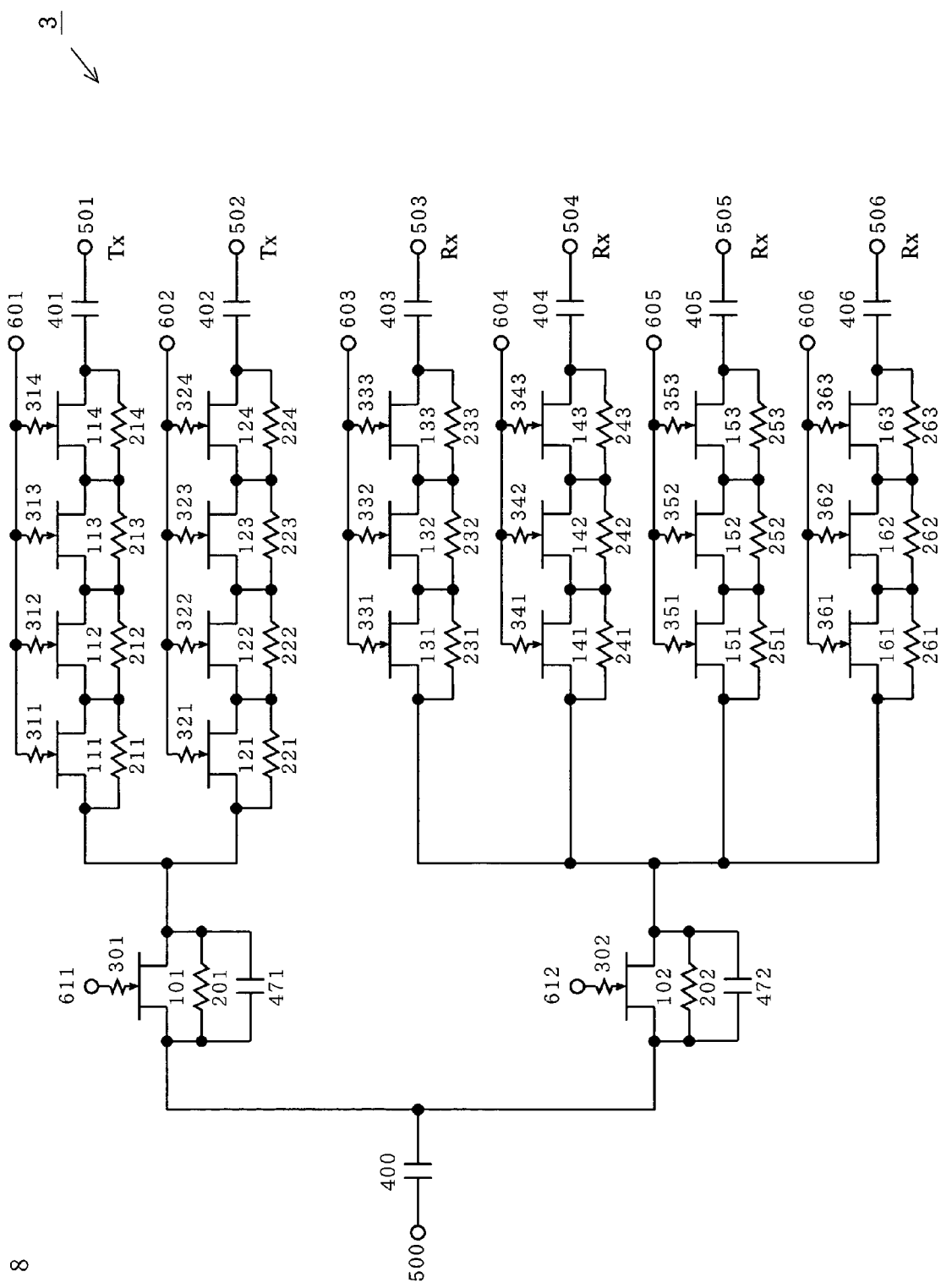
FIG. 8 shows a configuration of a radio-frequency switching circuit 3 according to a third embodiment of the present invention.

FIG. 8 shows a configuration of a radio-frequency switching circuit 3 according to a third embodiment of the present invention. The radio-frequency switching circuit 3 according to the third embodiment comprises: FETs 101, 102, 111 to 114, 121 to 124, 131 to 133, 141 to 143, 151 to 153 and 161 to 163; resistors 201, 202, 211 to 214, 221 to 224, 231 to 233, 241 to 243, 251 to 253, 261 to 263, 301, 302, 311 to 314, 321 to 324, 331 to 333, 341 to 343, 351 to 353 and 361 to 363; capacitors 400 to 406, 471 and 472; a common terminal 500; independent terminals 501 to 506; and control terminals 601 to 606, 611 and 612.

As shown in FIG. 8, the radio-frequency switching circuit 3 according to the third embodiment has a configuration which is a result of adding capacitances 471 and 472 as reactance circuits to the radio-frequency switching circuit 1 according to the first embodiment. Since a fundamental function and effect of the radio-frequency switching circuit 3 are same as those of the circuit 1 described in the first embodiment, the circuit 3 will be described below with a focus on an effect provided by component elements thereof which are different from those of the circuit 1.

The capacitor 471 is connected, in parallel with the FET 101, to a drain and source of the FET 101. The capacitor 472 is connected, in parallel with the FET 102, to a drain and source of the FET 102. These capacitances 471 and 472 are inserted so as to reduce gate widths of the FETs 101 and 102. Since the gate widths of the FETs 101 and 102 are respectively determined based on capacitance values thereof which are obtained when the FETs 101 and 102 are in off-state, the gate widths of the FETs 101 and 102 can be reduced by substituting a capacitance value of the capacitor 471 for a part of the capacitance value of the FET 101 in off-state, and substituting a capacitance value of the capacitor 472 for a part of the capacitance value of the FET 102 in off-state.

Since an off-capacitance value of each FET is 0.1 pF per 1 mm of gate width, the off-capacitance value of the FET 102 having a gate width of 4 mm is 0.4 pF. By substituting a capacitance value of the capacitor 472 for 0.3 pf out of the off-capacitance value 0.4 pf, the gate width of the FET 102 can be reduced to 1 mm. An FET having a gate width of 1 mm occupies 10,000 square micrometers on a semiconductor substrate, whereas a capacitor having a capacitance of 0.1 pF occupies 1,000 square micrometers, i.e., one tenth of the square micrometers occupied by the FET. For this reason, a chip size is greatly reduced by substituting a capacitance value of a capacitor for a part of an off-capacitance value of an FET. Similarly, by setting a capacitance value of the capacitor 471 to 0.3 pF, the gate width of the FET 101 can be reduced to 1 mm.

As described above, the radio-frequency switching circuit 3 according to the third embodiment of the present invention is capable of reducing the gate widths of the common FETs, thereby reducing a chip size of a switching circuit integrated on a semiconductor substrate.

Fourth Embodiment

Figure 9:
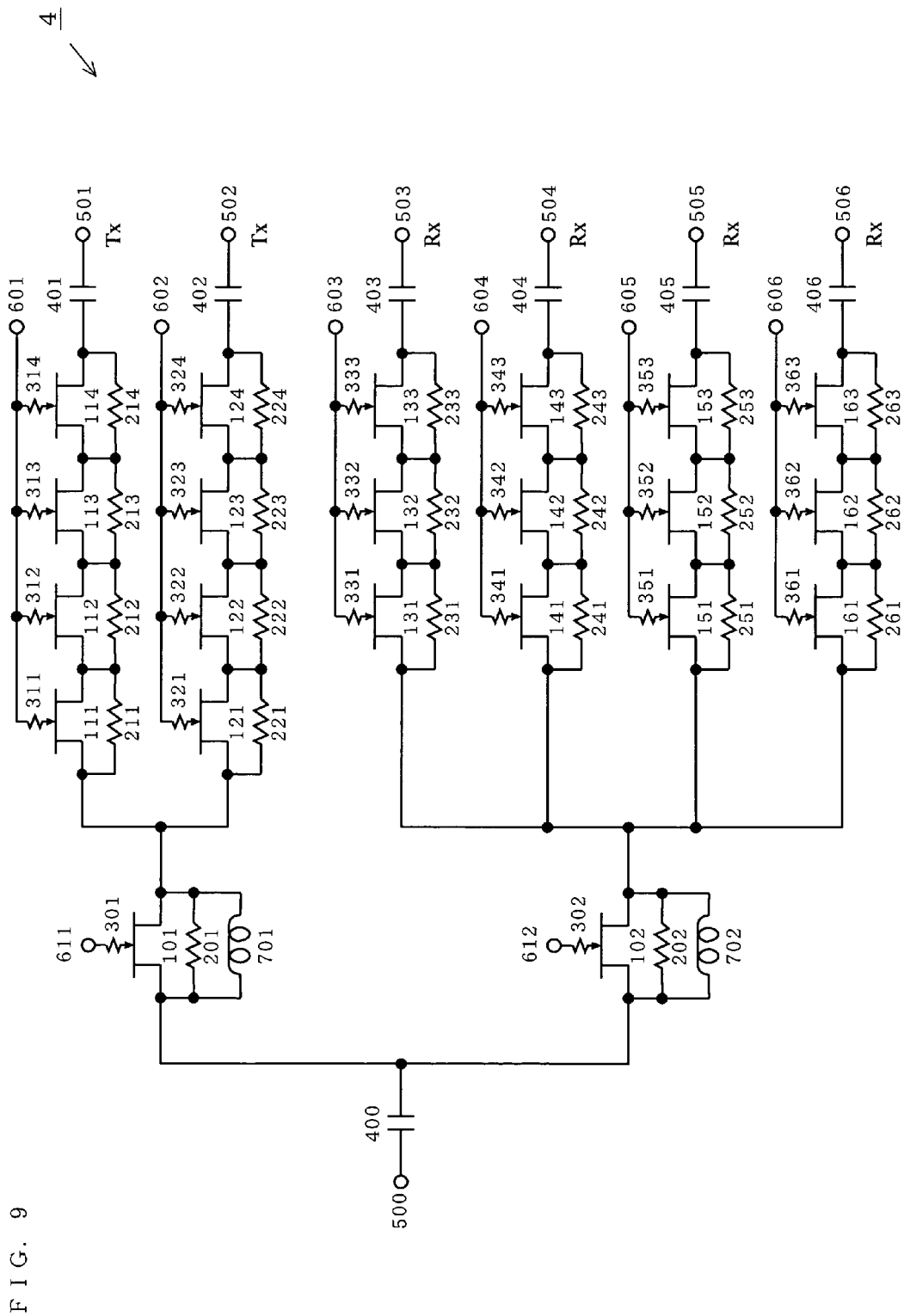
FIG. 9 shows a configuration of a radio-frequency switching circuit 4 according to a fourth embodiment of the present invention.

FIG. 9 shows a configuration of a radio-frequency switching circuit 4 according to a fourth embodiment of the present invention. The radio-frequency switching circuit 4 according to the fourth embodiment comprises: FETs 101, 102, 111 to 114, 121 to 124, 131 to 133, 141 to 143, 151 to 153 and 161 to 163; resistors 201, 202, 211 to 214, 221 to 224, 231 to 233, 241 to 243, 251 to 253, 261 to 263, 301, 302, 311 to 314, 321 to 324, 331 to 333, 341 to 343, 351 to 353 and 361 to 363; capacitors 400 to 406; inductors 701 and 702; a common terminal 500; independent terminals 501 to 506; control terminals 601 to 606, 611 and 612.

As shown in FIG. 9, the radio-frequency switching circuit 4 according to the fourth embodiment has a configuration which is a result of adding inductors 701 and 702 as reactance circuits to the radio-frequency switching circuit 1 according to the first embodiment. Since a fundamental function and effect of the radio-frequency switching circuit 4 are same as those of the circuit 1 described in the first embodiment, the circuit 4 will be described below with a focus on an effect provided by component elements thereof which are different from those of the circuit 1.

The inductor 701 is connected, in parallel with the FET 101, to a drain and source of the FET 101. The inductor 702 is connected, in parallel with the FET 102, to a drain and source of the FET 102. Such a configuration allows a parallel resonance circuit to be formed by the off-capacitance of the FET 101 and the parallel inductor 701 when the FET 101 is in off-state, and also allows a parallel resonance circuit to be formed by the off-capacitance of the FET 102 and the parallel inductor 702 when the FET 102 is in off-state. This makes it possible to obtain a favorable isolation characteristic at a desired frequency. Since the off-capacitance of the FET 102 is approximately 0.4 pF, a parallel resonance frequency of the parallel resonance circuit formed by a capacitor, i.e., the off-capacitance of the FET 102, and an inductor, i.e., the inductor 702, can be set to 1.9 GHz by setting an inductance value of the inductor 702 to 17 nH.

As described above, in the radio-frequency switching circuit 4 according to the fourth embodiment of the present invention, parallel resonance circuits are formed when the common FETs are in off-state. This, when a signal (e.g., UMT or PCS) is transmitted from the transmission terminal 501 or 502 to the common terminal 500, prevents the signal from leaking to the reception terminals 503 to 506.

Note that as a reactance circuit to be connected to a common FET in parallel, a capacitor and inductor connected in parallel may be used. This allows an inductor value to be reduced. Consequently, when the radio-frequency switching circuit 4 is integrated on a semiconductor substrate, a space to be occupied by the inductor, which is substantial when the inductor is provided without a capacitor, is reduced.

Fifth Embodiment

Figure 10:
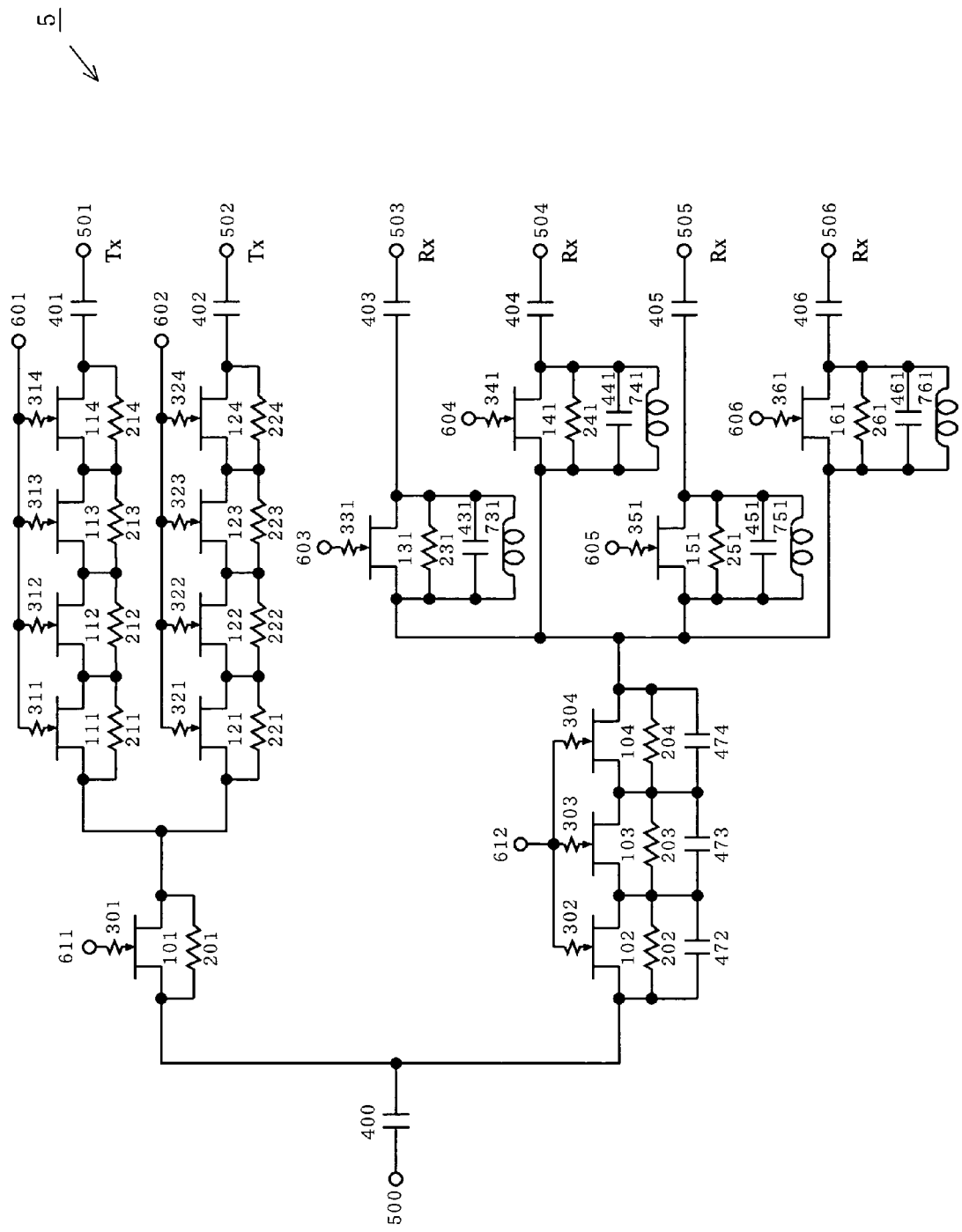
FIG. 10 shows a configuration of a radio-frequency switching circuit 5 according to a fifth embodiment of the present invention.

FIG. 10 shows a configuration of a radio-frequency switching circuit 5 according to a fifth embodiment of the present invention. The radio-frequency switching circuit 5 according to the fifth embodiment comprises: FETs 101 to 104, 111 to 114, 121 to 124, 131, 141, 151 and 161; resistors 201 to 204, 211 to 214, 221 to 224, 231, 241, 251, 261, 301 to 304, 311 to 314, 321 to 324, 331, 341, 351 and 361; capacitors 400 to 406, 431, 441, 451, 461 and 472 to 474; inductors 731, 741, 751 and 761; a common terminal 500; independent terminals 501 to 506; and control terminals 601 to 606, 611 and 612.

As shown in FIG. 10, the radio-frequency switching circuit 5 according to the fifth embodiment has a configuration which is a result of replacing the reception paths of the radio-frequency switching circuit 1 according to the first embodiment, which are constituted by: the FETs 102, 131 to 133, 141 to 143, 151 to 153 and 161 to 163; and resistors 202, 231 to 233, 241 to 243, 251 to 253, 261 to 263, 302, 331 to 333, 341 to 343, 351 to 353 and 361 to 363, with reception paths which are constituted by: FETs 102 to 104, 131, 141, 151 and 161; resistors 202 to 204, 231, 241, 251, 261, 302 to 304, 331, 341, 351 and 361; capacitors 431, 441, 451, 461 and 472 to 474; and inductors 731, 741, 751 and 761. Since a fundamental function and effect of the radio-frequency switching circuit 5 are same as those of the circuit 1 described in the above first embodiment, the radio-frequency switching circuit 5 will be described below with a focus on an effect provided by component elements thereof which are different from those of the circuit 1.

The FET 103 has a drain and source thereof connected via the resistor 203 and capacitor 473 which are in parallel with the FET 103, and the FET 104 has a drain and source thereof connected via the resistor 204 and capacitor 474 which are in parallel with the FET 104. The control terminal 612 is connected to gates of the FETs 103 and 104 via the resistors 303 and 304, respectively. The FETs 103 and 104 are serially connected, and the drain of the FET 103 is connected to the source of the FET 102. The FET 131 has a drain and source thereof connected via the resistor 231, capacitor 431 and the inductor 731 which are in parallel with the FET 131; the FET 141 has a drain and source thereof connected via the resistor 241, capacitor 441 and inductor 741 which are in parallel with the FET 141; the FET 151 has a drain and source thereof connected via the resistor 251, capacitor 451 and inductor 751 which are in parallel with the FET 151: and the FET 161 has a drain and source thereof connected via the resistor 261, capacitor 461 and inductor 761 which are in parallel with the FET 161. The control terminals 603 to 606 are respectively connected to gates of the FETs 131 to 161 respectively via the resistors 331, 341, 351 and 361. The drains of the FETs 131, 141, 151 and 161 are connected to a source of the FET 104. The sources of the FETs 131, 141, 151 and 161 are respectively connected to the reception terminals 503 to 506 respectively via the capacitors 403 to 406. As a result, the FETs 102 to 104 function as a common switching section for reception.

When a signal is transmitted from the transmission terminal 501 to the common terminal 500 in the radio-frequency switching circuit 5 according to the fifth embodiment having the above configuration, a high voltage is applied to the control terminals 601 and 611, and a low voltage is applied to the control terminals 602 to 606 and 612. This causes the FETs 101 and 111 to 114 to be in on-state, and the other FETs to be in off-state. Accordingly, a transmission signal is transmitted from the transmission terminal 501 to the common terminal 500. At this point, parallel resonance circuits are formed by: the inductor 731 and the off-capacitance of the FET 131; the inductor 741 and the off-capacitance of the FET 141; the inductor 751 and the off-capacitance of the FET 151; and the inductor 761 and the off-capacitance of the FET 161. In each parallel resonance circuit, impedance becomes maximum at a resonance frequency thereof. This makes it possible to obtain high isolation between input and output terminals.

For example, in FIG. 10, by setting the capacitor 431 to 3.3 pF and the inductor 731 to 2 nH, a resonance frequency of a parallel resonance circuit including an off-capacitance of 0.1 pF of the FET 131 can be set to 1.9 GHz. Also, by setting the capacitor 441 to 16 pF and the inductor 741 to 2 nH, a resonance frequency of a parallel resonance circuit including an off-capacitance of 0.1 pf of the FET 141 can be set to 0.9 GHz. Here, assuming that the reception terminal 503 is a terminal for receiving a signal of 900 MHz and the reception terminal 504 is a terminal for receiving a signal of 1.9 GHz, an isolation of approximately 40 dB from the reception terminal 504 to the reception terminal 503 is obtained at 1.9 GHz when the FET 131 in off-state. Whereas, when the FET 141 is in off-state, an isolation of approximately 40 dB from the reception terminal 503 to the reception terminal 504 is obtained at 0.9 GHz.

As described above, in the radio-frequency switching circuit 5 according to the fifth embodiment of the present invention, parallel resonance circuits are formed when the FETs constituting the reception paths are in off-state. This makes it possible to obtain isolation between reception terminals. Thus, a favorable characteristic is obtained.

As described in the above fifth embodiment, the capacitors 472 to 474, 431, 441, 451 and 461 are used to reduce the gate widths of the FETs 102 to 104, 131, 141, 151 and 161. Since the three FETs 102 to 104 are serially connected, total gate widths of the reception paths are reduced. Consequently, when the circuit 5 is integrated on a semiconductor substrate, a chip size thereof is reduced.

Sixth Embodiment

Figure 11:
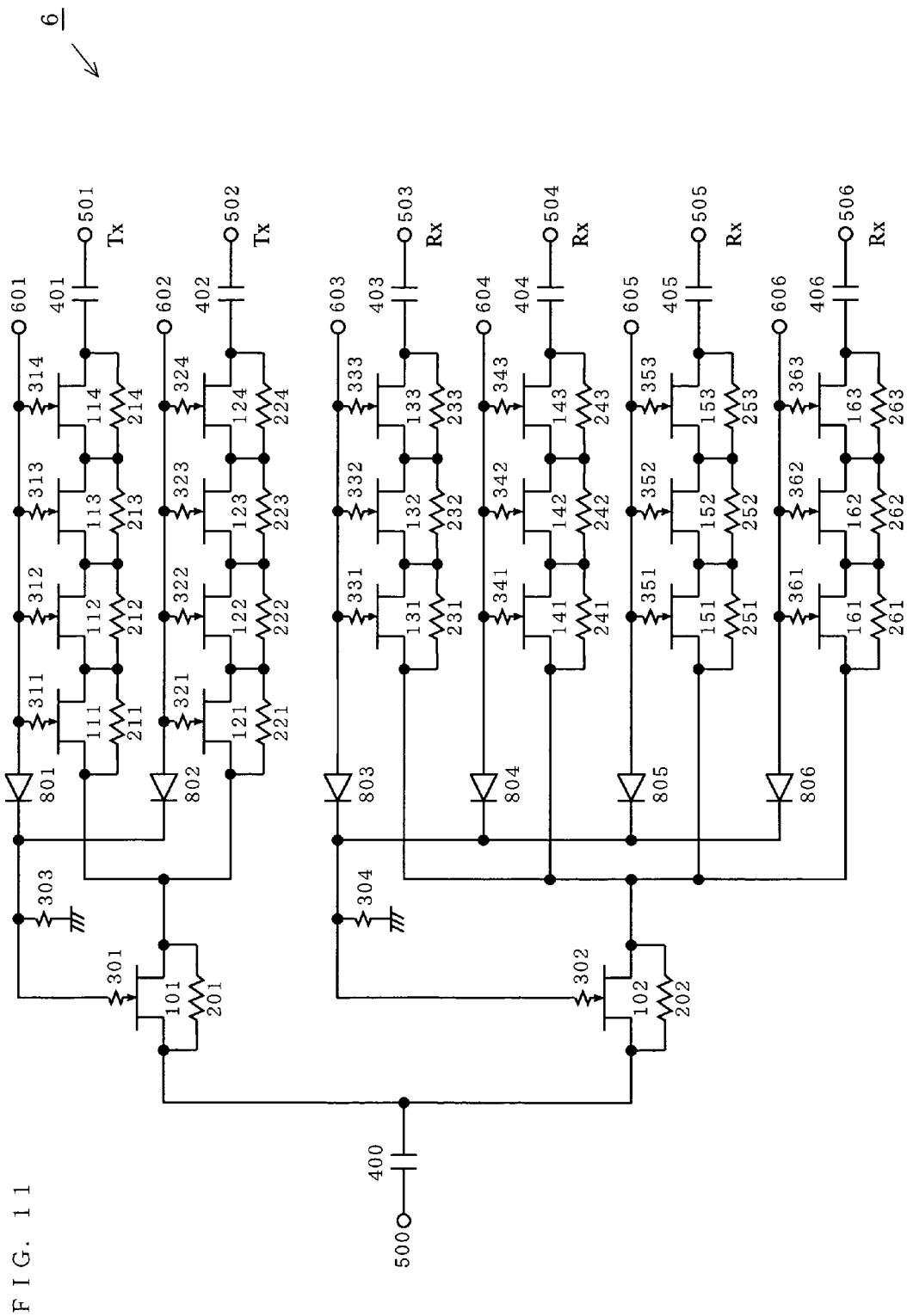
FIG. 11 shows a configuration of a radio-frequency switching circuit 6 according to a sixth embodiment of the present invention.

FIG. 11 shows a configuration of a radio-frequency switching circuit 6 according to a sixth embodiment of the present invention. The radio-frequency switching circuit 6 according to the sixth embodiment comprises: FETs 101, 102, 111 to 114, 121 to 124, 131 to 133, 141 to 143, 151 to 153 and 161 to 163; resistors 201, 202, 211 to 214, 221 to 224, 231 to 233, 241 to 243, 251 to 253, 261 to 263, 301 to 304, 311 to 314, 321 to 324, 331 to 333, 341 to 343, 351 to 353 and 361 to 363; capacitors 400 to 406; diodes 801 to 806; a common terminal 500; independent terminals 501 to 506; and control terminals 601 to 606.

As shown in FIG. 11, the radio-frequency switching circuit 6 according to the sixth embodiment has a configuration which is a result of adding, to the radio-frequency switching circuit 1 according to the above first embodiment, diodes 801 to 806 performing control functions of the control terminals 611 and 612. Since a fundamental function and effect of the radio-frequency switching circuit 6 are same as those of the circuit 1 described in the above first embodiment, the radio-frequency switching circuit 6 will be described below with a focus on an effect provided by component elements thereof which are different from those of the circuit 1.

Anodes of the diodes 801 to 806 are respectively connected to the control terminals 601 to 606. Cathodes of the diodes 801 and 802 are grounded via the resistor 303, and also connected to a gate of the FET 101 via the resistor 301. Cathodes of the diodes 803 to 806 are grounded via the resistor 304, and also connected to a gate of the FET 102 via the resistor 302. Accordingly, a logical OR of signals from the control terminals 601 and 602 is used as a control signal for the FET 101, and a logical OR of signals from the control terminals 603 to 606 is used as a control signal for the FET 102.

For this reason, when either one of the control terminals 601 and 602 has a high voltage, a gate voltage of the FET 101 is also high, and this causes the FET 101 to be in on-state. Similarly, when either one of the control terminals 603 to 606 has a high voltage, a gate voltage of the FET 102 is also high, and this causes the FET 102 to be in on-state. Note that, the resistor 303 is provided in order to release an electrical charge stored on the gate of the FET 101 when voltages of corresponding control terminals become low at the same time, and the resistor 304 is provided in order to release an electrical charge stored on the gate of the FET 102 when voltages of corresponding control terminals become low at the same time. By inserting the resistors 303 and 304, a speed at which each of the FETs 101 and 102 switches from on-state to off-state can be increased, and as a result, a switching circuit having a high response speed is realized.

As described above, in the radio-frequency switching circuit 6 according to the sixth embodiment of the present invention, the common FETs are controlled by using signals each resulting from performing a logic operation of control signals. This allows the number of control terminals and pad electrodes to be reduced. As a result, when the circuit 6 is integrated on a semiconductor substrate, a chip size thereof is reduced.

Figure 12:
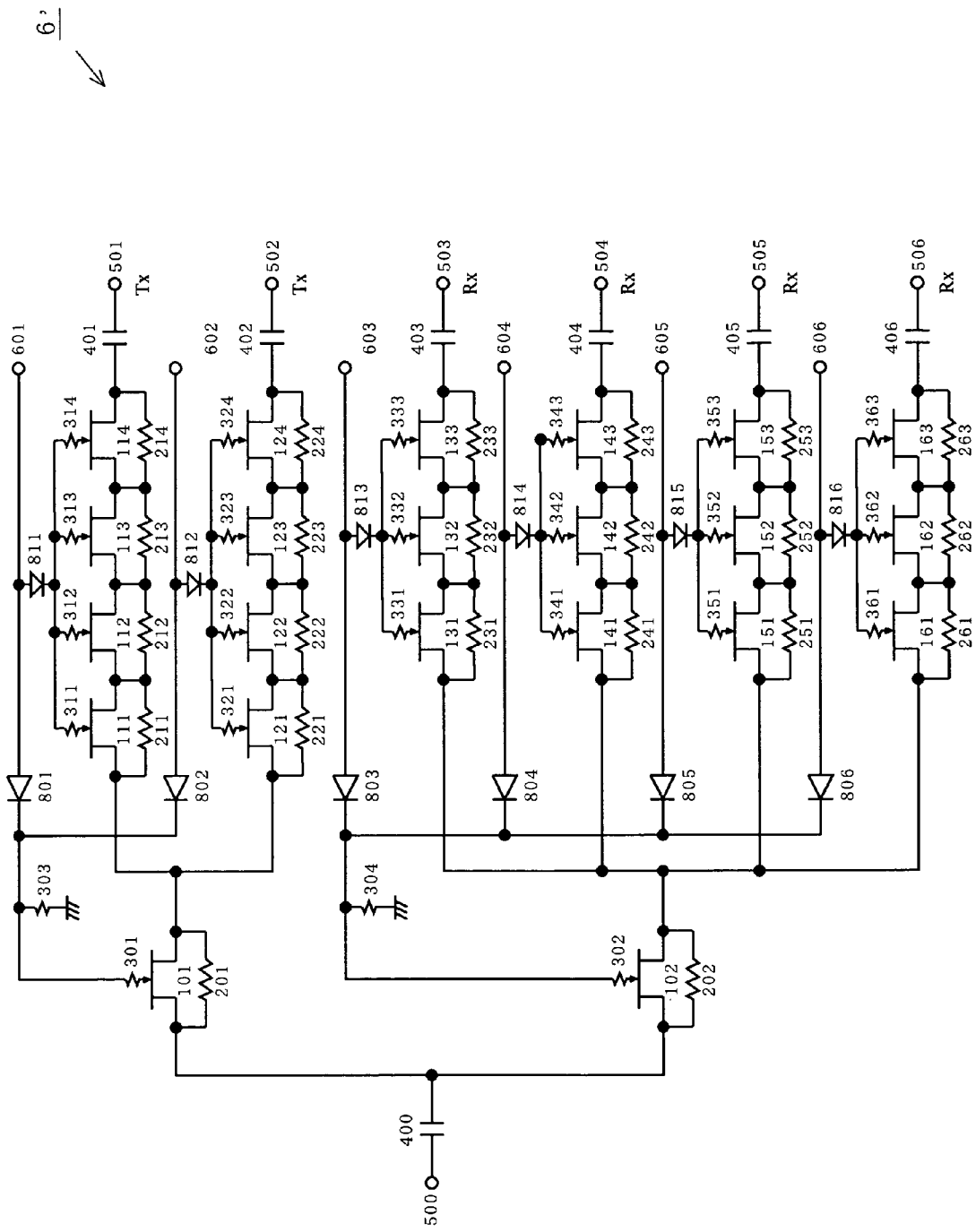
FIG. 12 shows a configuration of a radio-frequency switching circuit 6' which is a result of modifying the radio-frequency switching circuit 6 according to the sixth embodiment.

Since the diodes 801 to 806 are inserted in the radio-frequency switching circuit 6, voltage drops of the diodes cause a 0.6v difference between a high voltage applied to bases of the common FETs 101 and 102 and a high voltage applied to bases of the other FETs. In order to eliminate this voltage difference, it is preferred to insert diodes 811 to 816 as illustratively shown in a radio-frequency switching circuit 6' of FIG. 12, such that a high voltage is applied, via the diodes 811 to 816, to the bases of the FETs other than the FETs 101 and 102. This allows each of the on-resistances of the FETs 101 and 102 to be equal to each of the on-resistances of the other FETs, thereby further reducing insertion loss.

Seventh Embodiment

Figure 13:
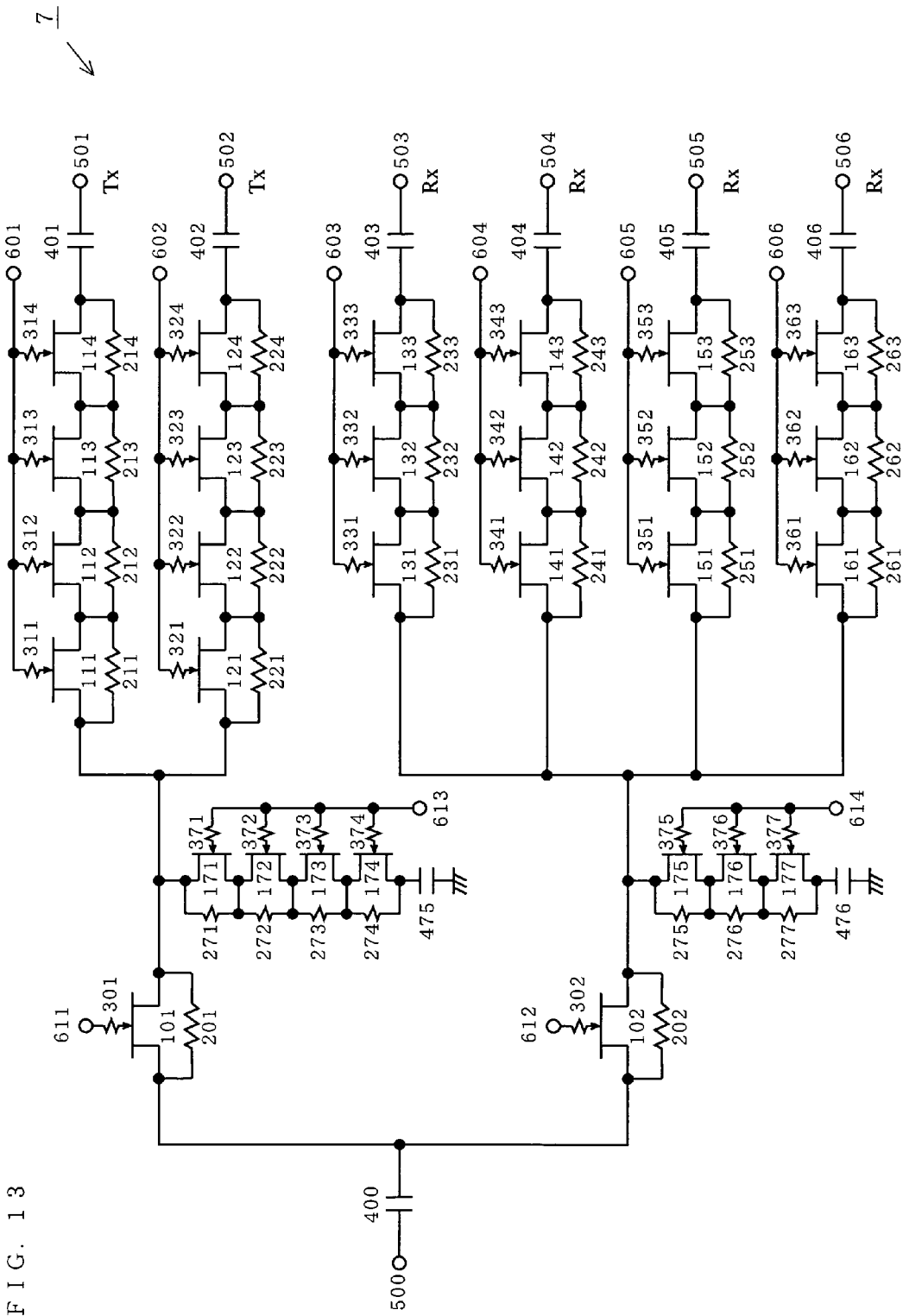
FIG. 13 shows a configuration of a radio-frequency switching circuit 7 according to a seventh embodiment of the present invention.

FIG. 13 shows a configuration of a radio-frequency switching circuit 7 according to a seventh embodiment of the present invention. The radio-frequency switching circuit 7 according to the seventh embodiment comprises: FETs 101, 102, 111 t 114, 121 to 124, 131 to 133, 141 to 143, 151 to 153, 161 to 163 and 171 to 177; resistors 201, 202, 211 to 214, 221 to 224, 231 to 233, 241 to 243, 251 to 253, 261 to 263, 271 to 277, 301, 302, 311 to 314, 321 to 324, 331 to 333, 341 to 343, 351 to 353, 361 to 363 and 371 to 377; capacitors 400 to 406, 475 and 476; a common terminal 500; independent terminals 501 to 506; and control terminals 601 to 606 and 611 to 614.

As shown in FIG. 13, the radio-frequency switching circuit 7 according to the seventh embodiment has a configuration which is a result of adding, to the radio-frequency switching circuit 1 according to the above first embodiment, the FETs 171 to 177, resistors 271 to 277 and 371 to 377, capacitors 475 and 476, and the control terminals 613 and 614. Since a fundamental function and effect of the radio-frequency switching circuit 7 are same as those of the circuit 1 described in the above first embodiment, the radio-frequency switching circuit 7 will be described below with a focus on an effect provided by component elements thereof which are different from those of the circuit 1.

The FETs 171 to 174 respectively have drains and sources thereof connected via the resistors 271 to 274 which are respectively in parallel with the FETs 171 to 174. Gates of the FETs 171 to 174 are connected to the control terminal 613 respectively via the resistors 371 to 374. The FETs 171 to 174 are serially connected. The drain of the FET 171 is connected to the source of the FET 101, and the source of the FET 174 is grounded via the capacitor 475. These FETs 171 to 174 collectively function as a common shunt circuit for transmission by which to short transmission paths to a ground. Similarly, the FETs 175 to 177 respectively have drains and sources thereof connected via the resistors 275 to 277 which are in parallel with the FETs 175 to 177. Gates of the FETs 175 to 177 are connected to the control terminal 614 respectively via the resistors 375 to 377. The FETs 175 to 177 are serially connected. The drain of the FET 175 is connected to the source of the FET 102, and the source of the FET 177 is grounded via the capacitor 476. These FETs 175 to 177 collectively function as a common shunt circuit for reception by which to short reception paths to a ground.

When a signal is transmitted from the transmission terminal 501 or the transmission terminal 502, a low voltage is applied to the control terminal 613 to cause the FETs 171 to 174 to be in off-state, and a high voltage is applied to the control terminal 614 to cause the FETs 175 to 177 to be in on-state. As a result, a radio-frequency signal leaking to a source side of the FET 102 via the off-capacitance of the FET 102 is released to the ground via the FETs 175 to 177. When a signal is received by one of the reception terminals 503 to 506, a high voltage is applied to the control terminal 613 to cause the FETs 171 to 174 to be in on-state, and a low voltage is applied to the control terminal 614 to cause the FETs 175 to 177 to be in off-state. As a result, a radio-frequency signal leaking to a source side of the FET 101 via the off-capacitance of the FET 101 is released to the ground via the FETs 171 to 174.

As described above, in the radio-frequency switching circuit 7 according to the seventh embodiment of the present invention, shunt circuits respectively connected to the sources of the common FETs are provided. This eliminates the necessity of providing a shunt circuit to each terminal, which is necessary in a conventional circuit, and thus the circuit 7 is simplified. Consequently, when the circuit 7 is integrated on a semiconductor substrate, a chip size thereof is reduced.

Eighth Embodiment

Figure 14:
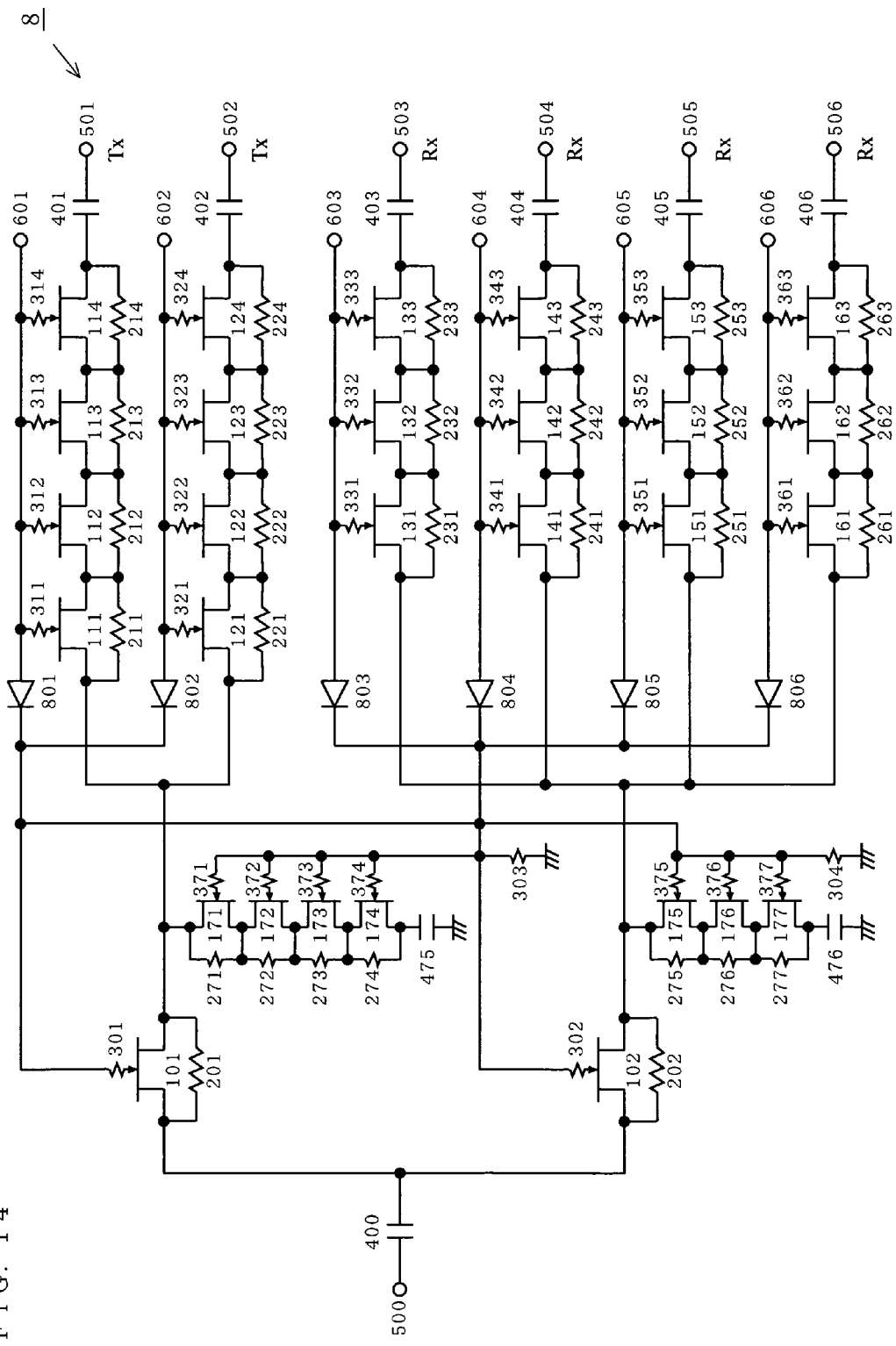
FIG. 14 shows a configuration of a radio-frequency switching circuit 8 according to an eighth embodiment of the present invention.

FIG. 14 shows a configuration of a radio-frequency switching circuit 8 according to an eighth embodiment of the present invention. The radio-frequency switching circuit 8 according to the eighth embodiment comprises: FETs 101, 102, 111 to 114, 121 to 124, 131 to 133, 141 to 143, 151 to 153, 161 to 163 and 171 to 177; resistors 201, 202, 211 to 224, 221 to 224, 231 to 233, 241 to 243, 251 to 253, 261 to 263, 271 to 277, 301, 302, 311 to 314, 321 to 324, 331 to 333, 341 to 343, 351 to 353, 361 to 363 and 371 to 377; capacitors 400 to 406, 475 and 476; a common terminal 500; independent terminals 501 to 506; and control terminals 601 to 606.

As shown in FIG. 14, the radio-frequency switching circuit 8 according to the eighth embodiment has a configuration which is a result of adding, to the radio-frequency switching circuit 1 according to the above first embodiment, FETs 171 to 177, resistors 271 to 277 and 371 to 377, capacitors 475 and 476, and diodes 801 to 806, and in which these newly-added component elements perform control functions of the control terminals 611 and 612 of the circuit 1. In other words, the radio-frequency switching circuit 8 is a result of combining a feature of the radio-frequency switching circuit 6 according to the sixth embodiment and a feature of the radio-frequency switching circuit 7 according to the seventh embodiment.

Therefore, the radio-frequency switching circuit 8 according to the eighth embodiment of the present invention is capable of reducing the number of control terminals and pad electrodes, and also eliminating the necessity of providing a shunt circuit to each terminal, which is necessary in a conventional circuit. Thus, the circuit 8 is simplified. Consequently, when the circuit 8 is integrated on a semiconductor substrate, a chip size thereof is reduced.

Ninth Embodiment

Figure 15:
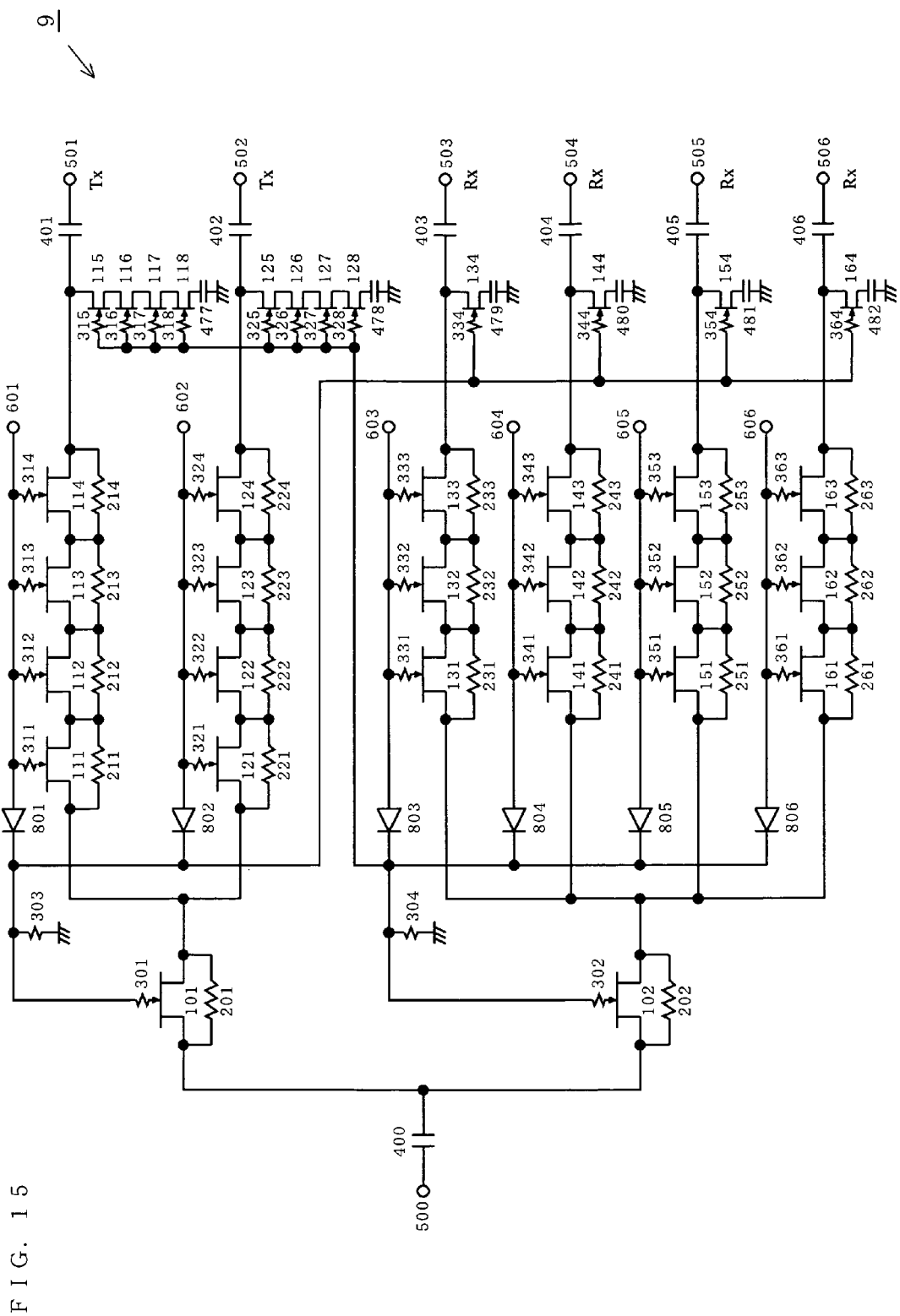
FIG. 15 shows a configuration of a radio-frequency switching circuit 9 according to a ninth embodiment of the present invention.

FIG. 15 shows a configuration of a radio-frequency switching circuit 9 according to a ninth embodiment of the present invention. The radio-frequency switching circuit 9 according to the ninth embodiment comprises: FETs 101, 102, 111 to 118, 121 to 128, 131 to 134, 141 to 144, 151 to 154 and 161 to 164; resistors 201, 202, 211 to 214, 221 to 224, 231 to 233, 241 to 243, 251 to 253, 261 to 263, 301, 302, 311 to 318, 321 to 328, 331 to 334, 341 to 344, 351 to 354 and 361 to 364; capacitors 400 to 406 and 477 to 482; diodes 801 to 806; a common terminal 500; independent terminals 501 to 506; and control terminals 601 to 606.

As shown in FIG. 15, the radio-frequency switching circuit 9 according to the ninth embodiment has a configuration which is a result of adding, to the radio-frequency switching circuit 6 according to the above sixth embodiment, FETs 115 to 118, 125 to 128, 134, 144, 154 and 164; resistors 315 to 318, 325 to 328, 334, 344, 354 and 364; and capacitors 477 to 482. Since fundamental functions and effects of the radio-frequency switching circuit 9 are same as those of the circuits 1 and 6 described in the first and sixth embodiments, the radio-frequency switching circuit 9 will be descried below with a focus on an effect provided by component elements which are different from those of the circuits 1 and 6.

Gates of the FETs 115 to 118 and 125 to 128 are connected to a cathode of the diode 803 respectively via the resistors 315 to 318 and 325 to 328. The FETs 115 to 118 are serially connected. A drain of the FET 115 is connected to a source of the FET 114, and a source of the FET 115 is grounded via the capacitor 477. These FETs 115 to 118 collectively function as a fundamental shunt circuit for transmission by which to short a transmission path of the transmission terminal 501 to a ground. Similarly, the FETs 125 to 128 are serially connected. A drain of the FET 125 is connected to a source of the FET 124, and a source of the FET 125 is grounded via the capacitor 478. These FETs 125 to 128 collectively function as a fundamental shunt circuit for transmission by which to short a transmission path of the transmission terminal 502 to the ground.

Gates of the FETs 134, 144, 154 and 164 are connected to a cathode of the diode 801 via the resistors 334, 344, 354 and 364, respectively. Drains of the FETs 134, 144, 154 and 164 are respectively connected to sources of the FETs 133, 143, 153 and 163. Sources of the FETs 134, 144, 154 and 164 are grounded via the capacitors 479 to 482, respectively. These FETs 134, 144, 154 and 164 function as fundamental shunt circuits for reception by which to respectively short reception paths of the reception terminals 503 to 506 to grounds.

When a signal is transmitted from the transmission terminal 501 or 502, a high voltage applied to a corresponding one of the control terminal 601 or 602 causes the FETs 134, 144, 154 and 164 to be in on-state, and all the reception paths are grounded. Also, when a signal is received by any of the reception terminals 503 to 506, a high voltage applied to a corresponding one of the control terminals 603 to 606 causes the FETs 115 to 118 and 125 to 128 to be in on-state, and all the transmission paths are grounded.

As described above, in the radio-frequency switching circuit 9 according to the ninth embodiment of the present invention, the reception terminals each perform a grounding operation for radio frequency components at the time of transmission, and the transmission terminals each perform a grounding operation for radio frequency components at the time of reception. This eliminates the necessity of providing control terminals respectively for shunt circuits, and allows high isolation to be obtained between the transmission terminals and reception terminals.

Tenth Embodiment

Figure 16:
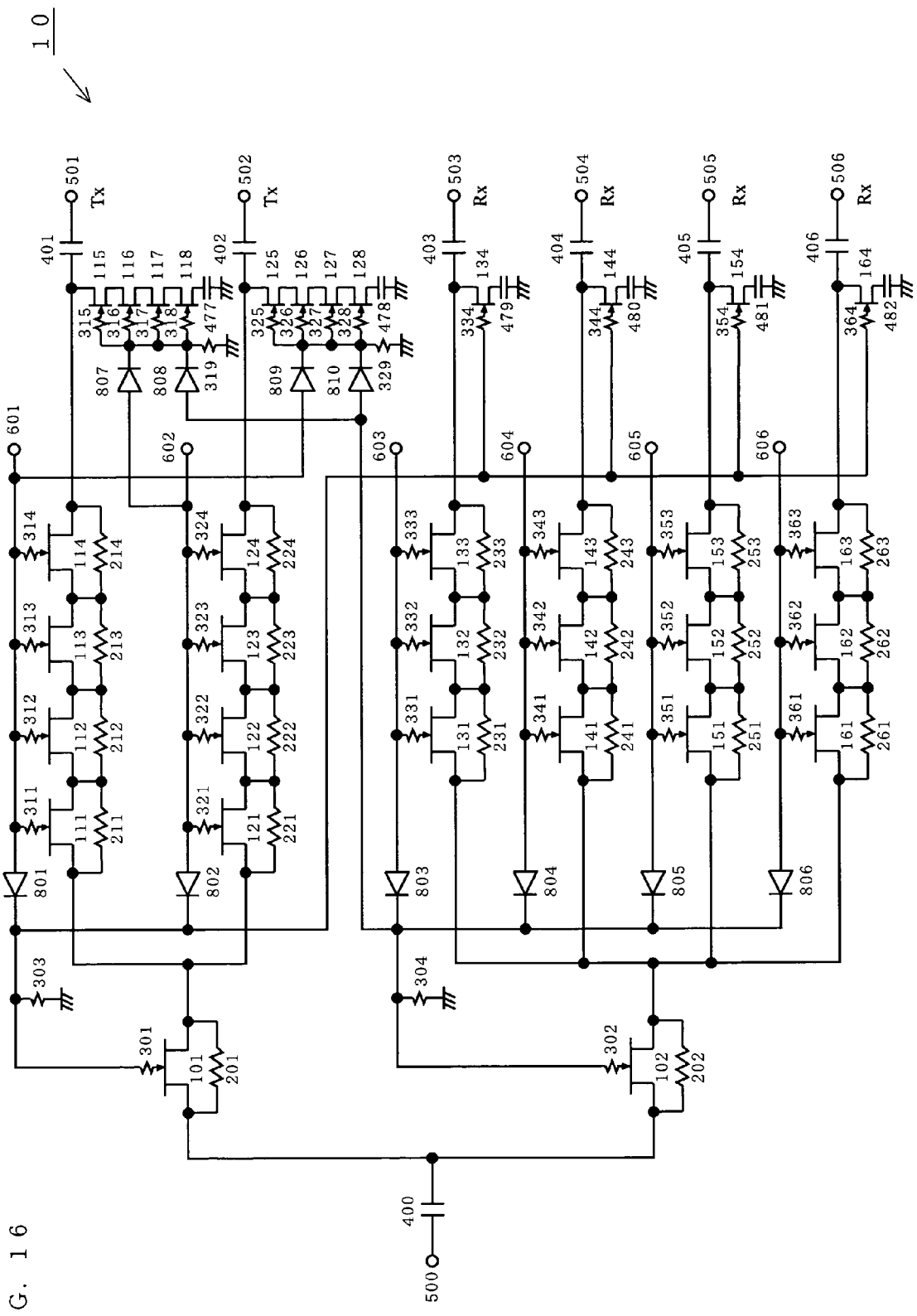
FIG. 16 shows a configuration of a radio-frequency switching circuit 10 according to a tenth embodiment of the present invention.

FIG. 16 shows a configuration of a radio-frequency switching circuit 10 according to a tenth embodiment of the present invention. The radio-frequency switching circuit 10 according to the tenth embodiment comprises: FETs 101, 102, 111 to 118, 121 to 128, 131 to 134, 141 to 144, 151 to 154 and 161 to 164; resistors 201, 202, 211 to 214, 221 to 224, 231 to 233, 241 to 243, 251 to 253, 261 to 263, 301, 302, 311 to 318, 321 to 328, 331 to 334, 341 to 344, 351 to 354 and 361 to 364; capacitors 400 to 406 and 477 to 482; diodes 801 to 810; a common terminal 500; independent terminals 501 to 506; and control terminals 601 to 606.

As shown in FIG. 16, the radio-frequency switching circuit 10 according to the tenth embodiment has a configuration which is a result of modifying the configuration of the radio-frequency switching circuit 9 according to the ninth embodiment such that the shunt circuits of the transmission paths are controlled via the diodes 807 to 810. Since fundamental functions and effects of the radio-frequency switching circuit 10 are same as those of the circuits 1 and 9 described in the above first and ninth embodiments, the radio-frequency switching circuit 10 will be described below with a focus on an effect provided by component elements thereof which are different from those of the circuits 1 and 9.

When a signal is transmitted from the transmission terminal 501, a high voltage is applied to the control terminal 601 to cause the FETs 125 to 128 to be in on-state. As a result, isolation between the transmission terminals 501 and 502 is obtained. When a signal is transmitted from the transmission terminal 502, a high voltage is applied to the control terminal 602 to cause the FETs 115 to 118 to be in on-state. As a result, isolation between the transmission terminals 501 and 502 is obtained. In both the above transmission statuses, shunt circuits (FET 134, 144, 154 and 164) of the reception paths are controlled by logical OR outputs of the diodes 801 and 802, and therefore isolation between the transmission terminals and reception terminals is obtained. At the time of reception, if any of the control terminals 603 to 606 has a high voltage, shunt circuits (the FET 115 to 118 and 125 to 128) of the transmission paths are caused to be in on-state at the same time, and therefore isolation between the transmission terminals and the reception terminals is obtained. Note that, the resistors 319 and 329 are provided in a same manner as that of the resistors 303 and 304 in order to release an electrical charge stored on a gate of each FET when voltages of control terminals become low at the same time.

As described above, in the radio-frequency switching circuit 10 according to the tenth embodiment of the present invention, when a signal is transmitted from a transmission terminal, the reception terminals and a remaining transmission terminal each perform a grounding operation for radio frequency components, and when a signal is received, the transmission terminals each perform a grounding operation for radio frequency components. This eliminates the necessity of providing control terminals for shunt circuits, and allows high isolation to be obtained between the transmission terminals and reception terminals.

Note that, each of all the FETs used in the radio-frequency switching circuit of each embodiment has an axisymmetric configuration having a gate as a center. For this reason, even if a drain and source of each FET are switched and connected in the above-described manner, the above-described effects can be obtained. Also, used as switching elements are not limited to the FETs of the present embodiments. General switching elements may be used as the switching elements.

Further, in each of the above embodiments, a configuration having two transmission paths and four reception paths is described. However, the number of transmission paths and the number of reception paths may be arbitrarily set.

Still further, in each of the above embodiments, four FETs are serially connected at the side of the transmission paths, and three FETs are serially connected at the side of the reception paths, becauase it is preferred that when the reception paths are seen from a drain position of the FET 102, the number of rows of FETs of each reception path corresponds to the number of rows of FETs of each transmission path. However, the number of rows of FETs at the side of the reception paths is not limited to three. When the number of rows of FETs at the side of the reception paths is increased, only one FET may be inserted such that the FET is serially connected to the FET 102, or a plurality of FETs may be respectively inserted into the branched reception paths. Note that, the number of rows of FETs constituting each shunt circuit is determined based on a same reason as above.

Figure 17:
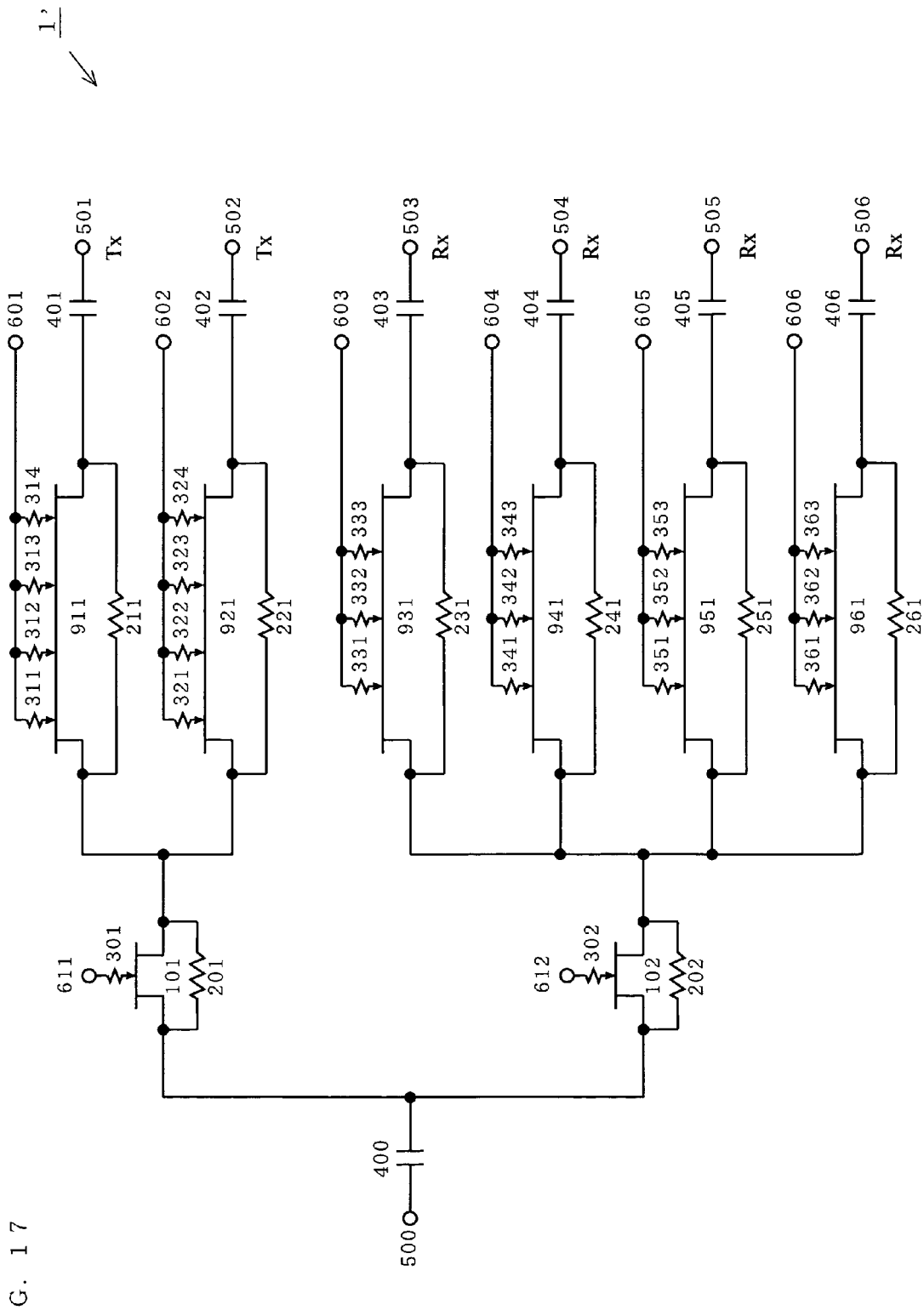
FIG. 17 shows a configuration of a radio-frequency switching circuit 1' which is a result of modifying the radio-frequency switching circuit 1 according to the first embodiment.
Figure 18:
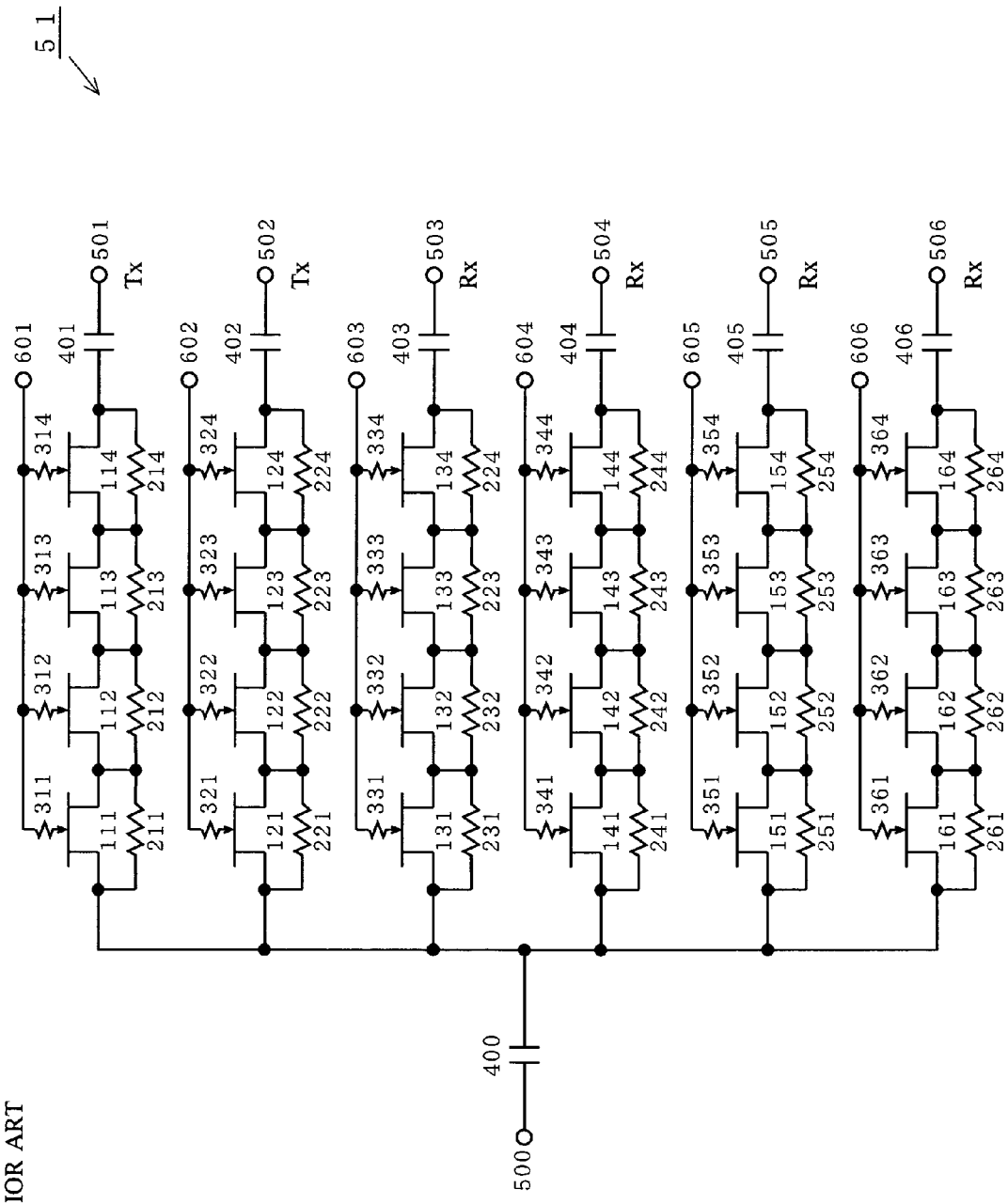
FIG. 18 shows a configuration of a conventional radio-frequency switching circuit 51.
Figure 19:
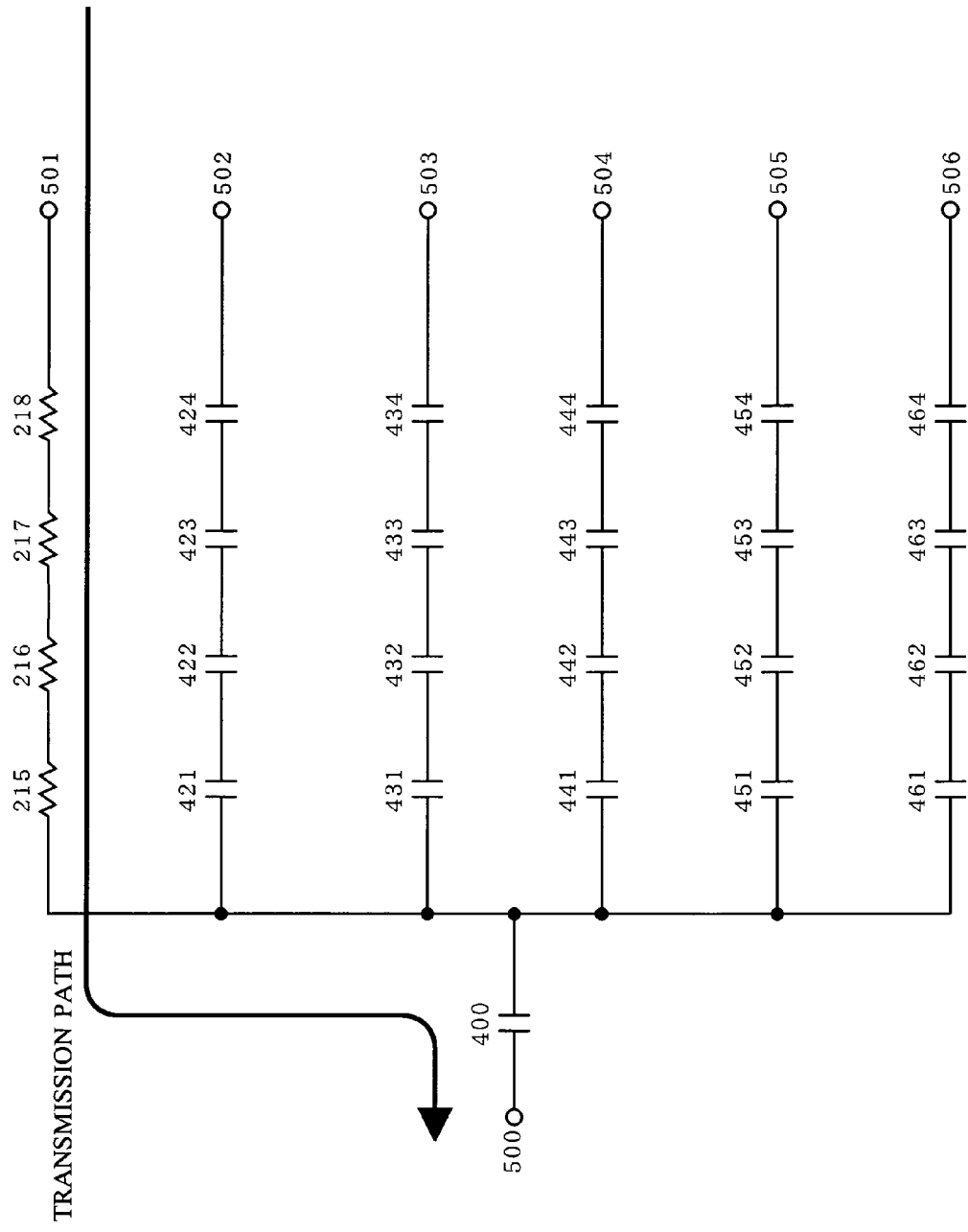
FIG. 19 shows an equivalent circuit of the conventional radio-frequency switching circuit 51 operating at the time of transmission.
Figure 20:
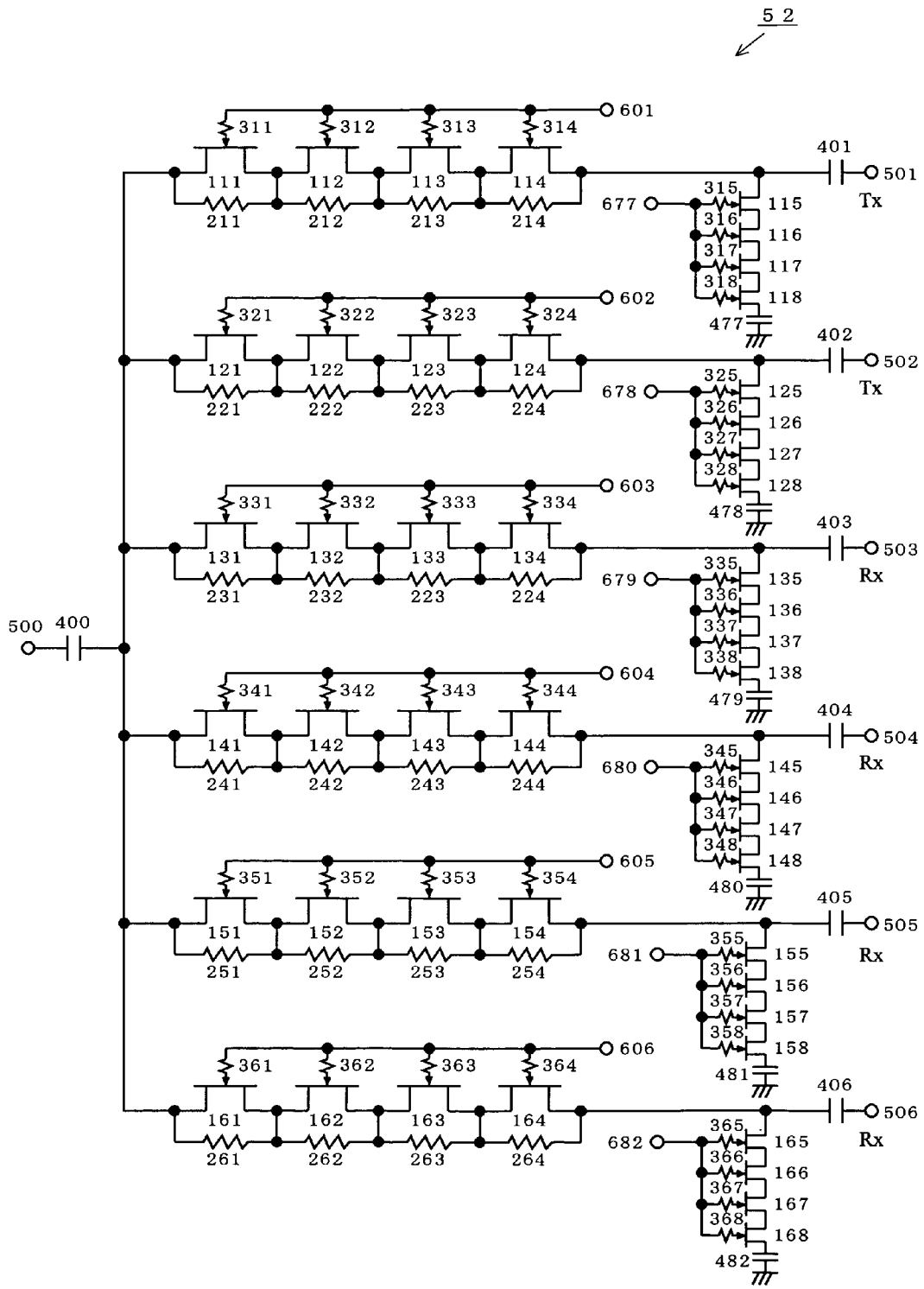
FIG. 20 shows a configuration of another conventional radio-frequency switching circuit 52.

Still further, each of the above embodiments describes a switching circuit having a configuration in which a plurality of FETs are serially connected. However, a multi-gate FET may be used instead of the plurality of FETs. FIG. 17 shows an example in which the radio-frequency switching circuit 1 according to the first embodiment is configured using multi-gate FETs. In the example of FIG. 17, a quad-gate FET having four gates between a drain and source thereof and a triple-gate FET having three gates between a drain and source thereof are used.

While the invention has been described in detail, the foregoing description is in all aspects illustrative and not restrictive. It is understood that numerous other modifications and variations can be devised without departing from the scope of the invention.

What is claimed is:

1. A radio-frequency switching circuit for controlling a transmission of a radio-frequency signal by changing a connection status between a common terminal and a plurality of independent terminals, the radio-frequency switching circuit comprising:

a plurality of common switching sections each having a first terminal to be connected, for a radio-frequency component, to the common terminal;

a plurality of fundamental switching sections, which are provided respectively corresponding to the plurality of independent terminals, each having a first terminal connected to a second terminal of any one of the plurality of common switching sections and having a second terminal to be connected, for the radio-frequency component, to any one of the plurality of independent terminals, wherein a common switching section for transmission is provided on transmission paths, through which radio-frequency signals respectively from transmission terminals among the plurality of independent terminals are transmitted to the common terminal, and a common switching section for reception is provided on reception paths, through which radio-frequency signals from the common terminal are respectively received by reception terminals among the plurality of independent terminals;

a common shunt circuit for transmission for controlling grounding of the second terminal of the common switching section for transmission; and a common shunt circuit for reception for controlling grounding of the second terminal of the common switching section for reception, wherein the common shunt circuit for transmission is structured by serially connected switching elements, a number of which is same as a number of switching elements by which each of a plurality of fundamental switching sections for transmission connected to the common shunt circuit for transmission is structured, and the common shunt circuit for reception is structured by serially connected switching elements, a number of which is same as a number of switching elements by which each of a plurality of fundamental switching sections for reception connected to the common shunt circuit for reception is structured.

2. A semiconductor device having a semiconductor substrate on which the radio-frequency switching circuit according to claim 1 is integrated.

3. A radio-frequency switching circuit for controlling a transmission of a radio-frequency signal by changing a connection status between a common terminal and a plurality of independent terminals, the radio-frequency switching circuit comprising:

a plurality of common switching sections each having a first terminal to be connected, for a radio-frequency component, to the common terminal;

a plurality of fundamental switching sections, which are provided respectively corresponding to the plurality of independent terminals, each having a first terminal connected to a second terminal of any one of the plurality of common switching sections and having a second terminal to be connected, for the radio-frequency component, to any one of the plurality of independent terminals; and a common shunt circuit for controlling grounding of the second terminal of at least one of the plurality of common switching sections, wherein the common shunt circuit is structured by serially connected switching elements, a number of which is same as a number of switching elements by which each fundamental switching section connected to the common shunt circuit is structured.

4. A semiconductor device having a semiconductor substrate on which the radio-frequency switching circuit according to claim 3 is integrated.

5. The radio-frequency switching circuit according to claim 3, wherein the plurality of common switching sections each are structured by one switching element, two or more switching elements which are serially connected, or three or more switching elements which are serially and parallel connected in a hierarchical manner.

6. The radio-frequency switching circuit according to claim 5, wherein a reactance circuit connects terminals of each switching element.

7. The radio-frequency switching circuit according to claim 5, wherein each switching element is a field-effect transistor.

8. The radio-frequency switching circuit according to claim 3, wherein the plurality of fundamental switching sections each are structured by one switching element, or two or more switching elements which are serially connected.

* * * * *